(12) United States Patent
Hironaka

(10) Patent No.: US 10,651,129 B1
(45) Date of Patent: May 12, 2020

(54) METHODS OF FORMING ALIGNMENT MARKS DURING PATTERNING OF SEMICONDUCTOR MATERIAL

(71) Applicant: Micron Technology, Inc., Boise, ID (US)

(72) Inventor: Hideo Hironaka, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/273,733

(22) Filed: Feb. 12, 2019

(51) Int. Cl.
*H01L 23/544* (2006.01)
*H01L 27/108* (2006.01)

(52) U.S. Cl.
CPC ...... *H01L 23/544* (2013.01); *H01L 27/10885* (2013.01); *H01L 2223/54426* (2013.01)

(58) Field of Classification Search
None
See application file for complete search history.

(56) References Cited

U.S. PATENT DOCUMENTS

| 8,389,383 | B1 | 3/2013 | Hopkins |
| 8,852,851 | B2 | 10/2014 | Zhou et al. |
| 2008/0230929 | A1 | 9/2008 | Shin et al. |
| 2009/0246709 | A1* | 10/2009 | Nakasugi ............... B82Y 10/00 430/319 |
| 2011/0156286 | A1* | 6/2011 | Ushida ................. G03F 9/7076 257/797 |
| 2014/0091434 | A1 | 4/2014 | Hopkins |
| 2019/0035743 | A1* | 1/2019 | Chang .................. H01L 23/544 |

\* cited by examiner

*Primary Examiner* — J. E. Schoenholtz
(74) *Attorney, Agent, or Firm* — Wells St. John P.S.

(57) ABSTRACT

Some embodiments include provision of a mass of semiconductor material having a first region and a second region. A first pattern set is formed to extend across the first region, and a third pattern set is formed to extend across the second region. The first pattern set includes first lines and first trenches between the first lines. The third pattern set includes alignment marks. The first trenches are utilized to form rails from the semiconductor material within the first region. The alignment marks are parallel to the rails. A second pattern set is formed to extend across the first region, and a fourth pattern set is formed to extend across the second region. The second pattern set includes first openings, and the fourth pattern set includes second openings. The first openings are utilized to subdivide the rails into pillars. The second openings transform the alignment marks into an overlay pattern.

31 Claims, 29 Drawing Sheets

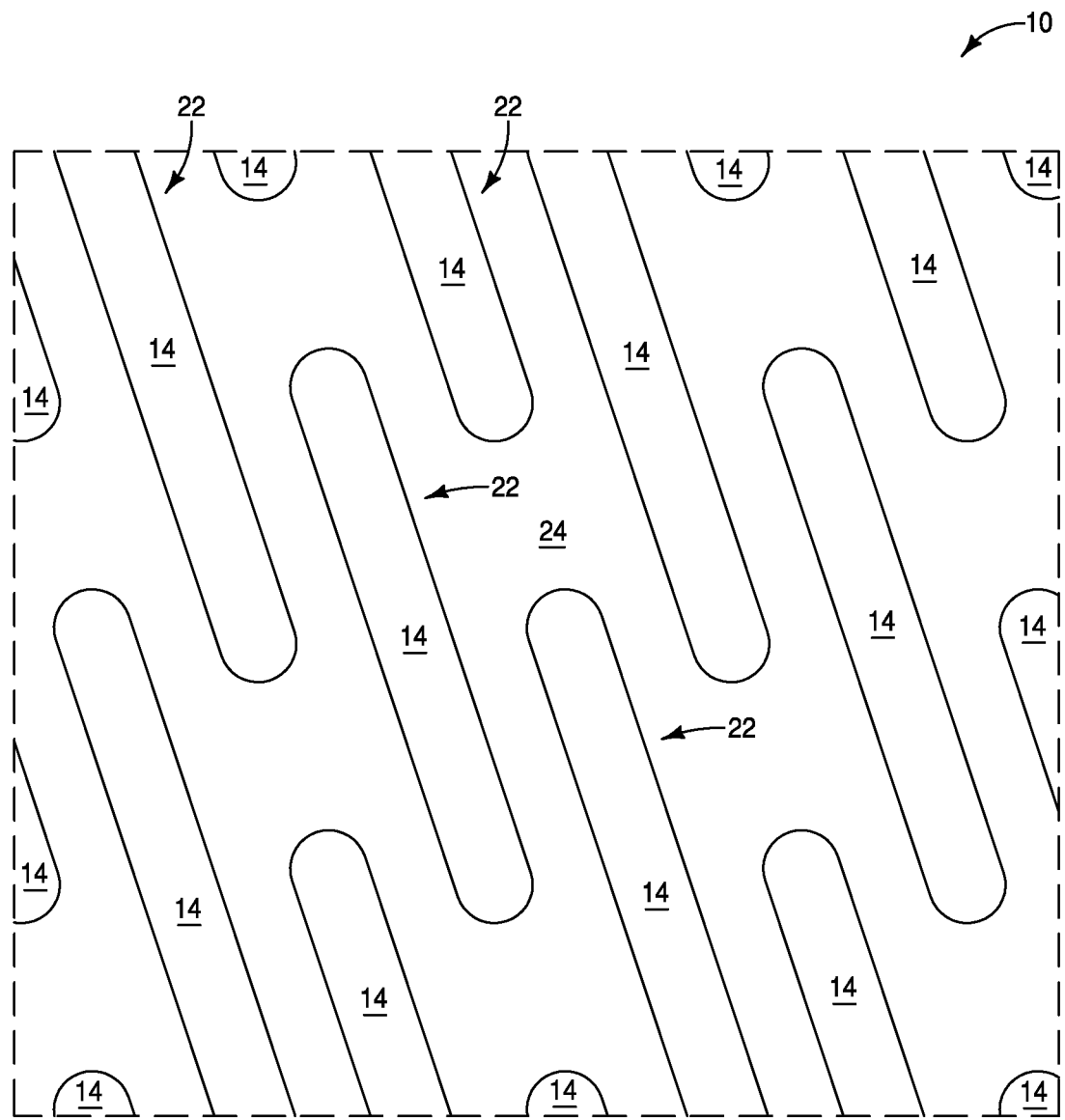
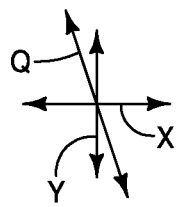
FIG. 4

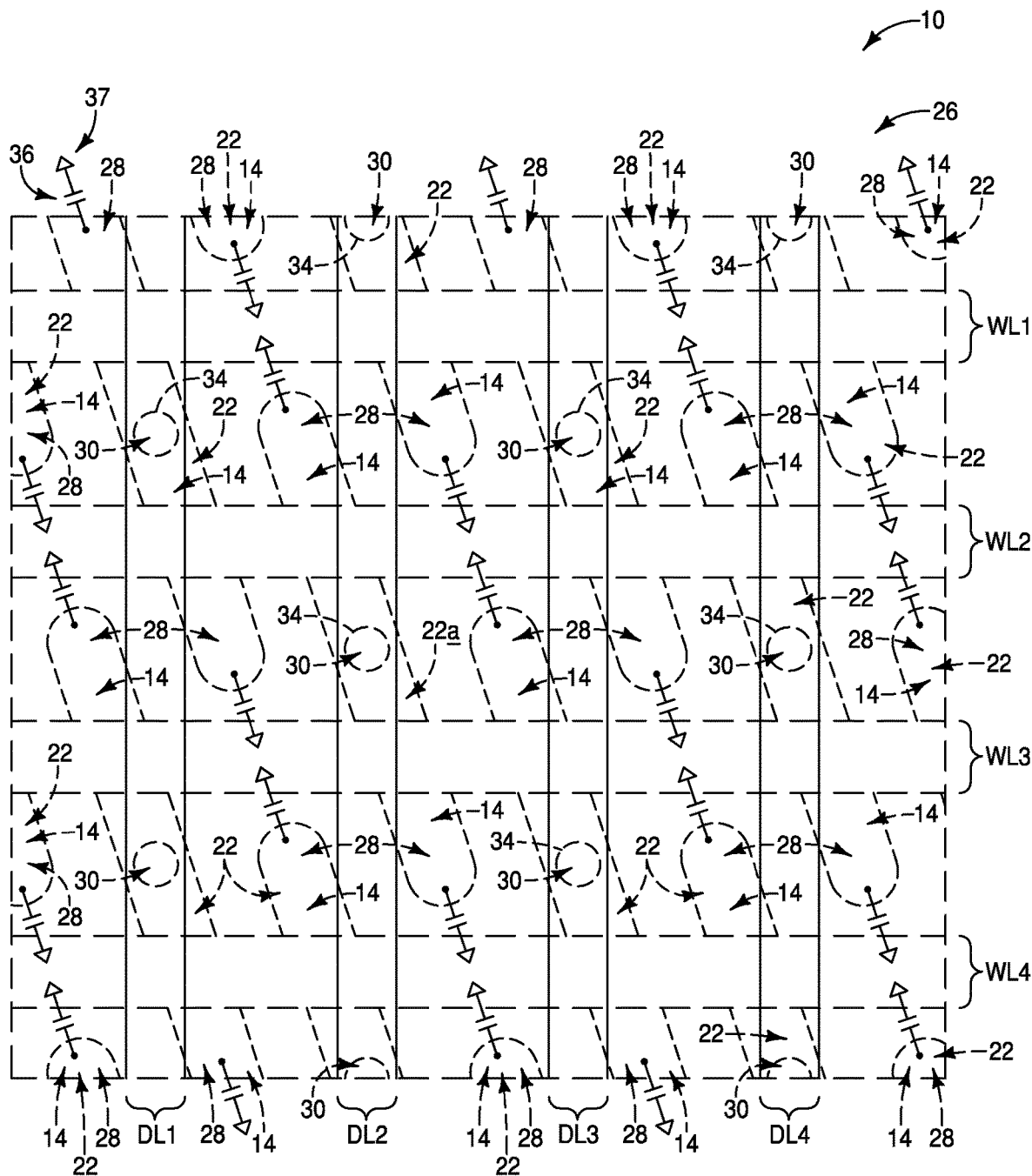
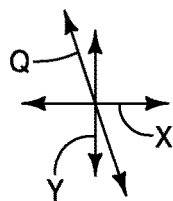
FIG. 5

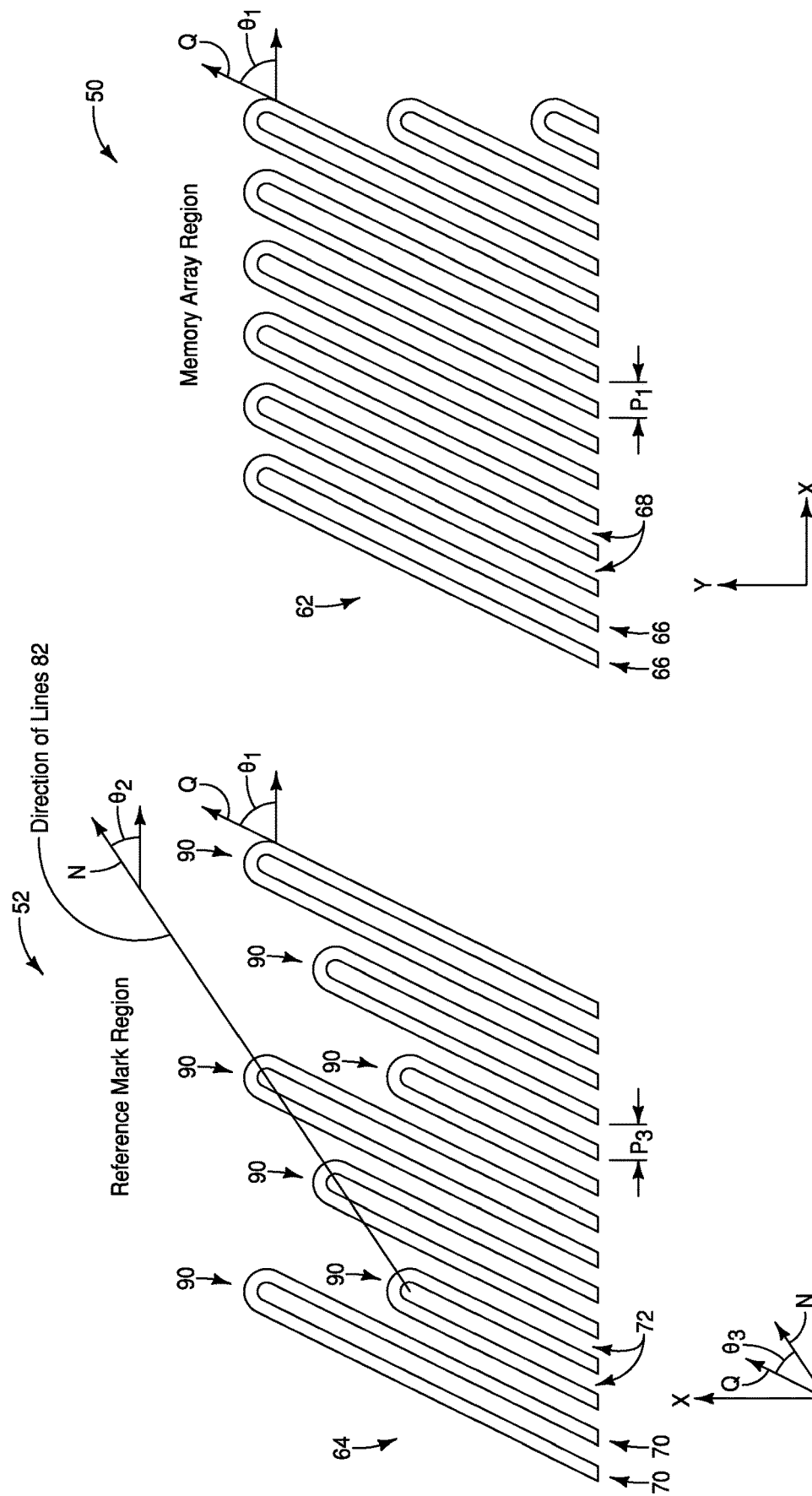

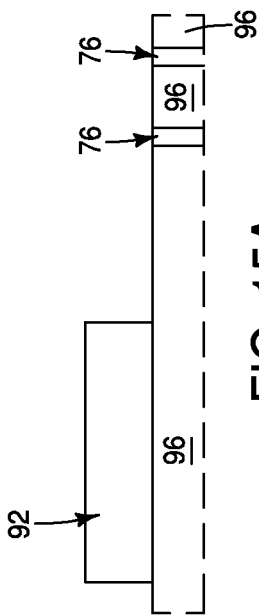
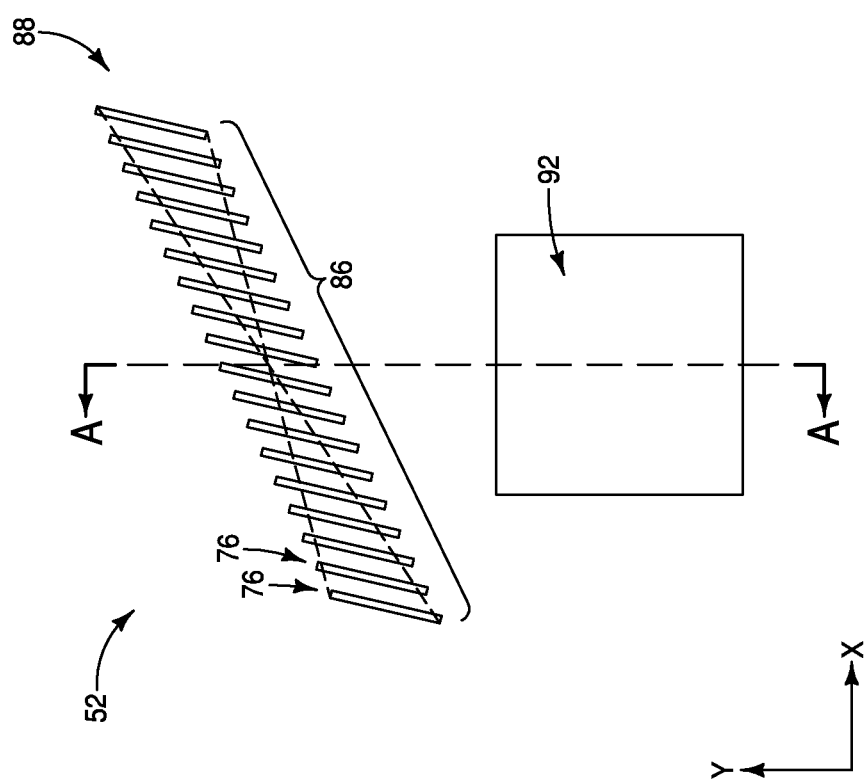
FIG. 15A
FIG. 15

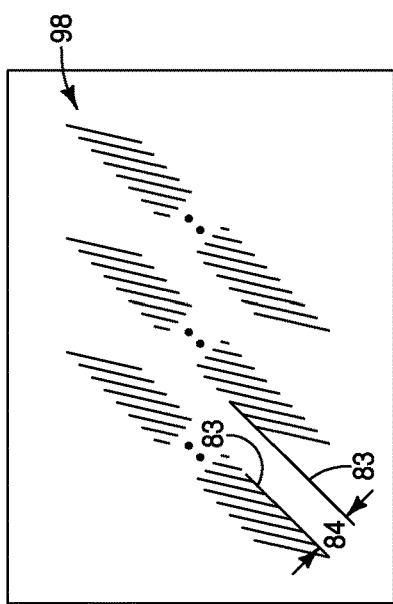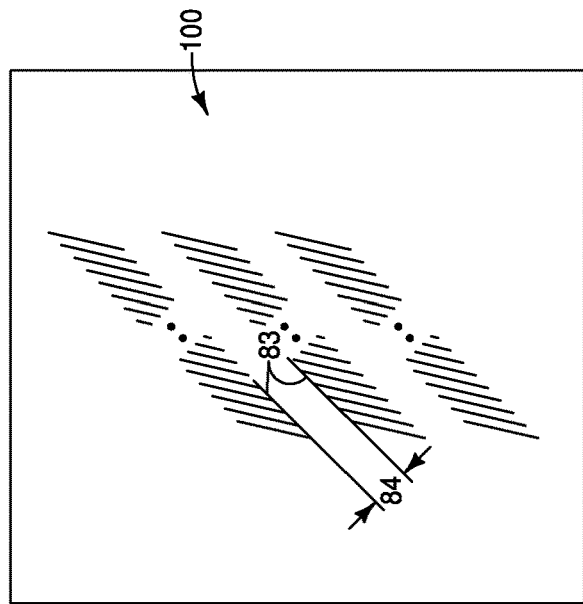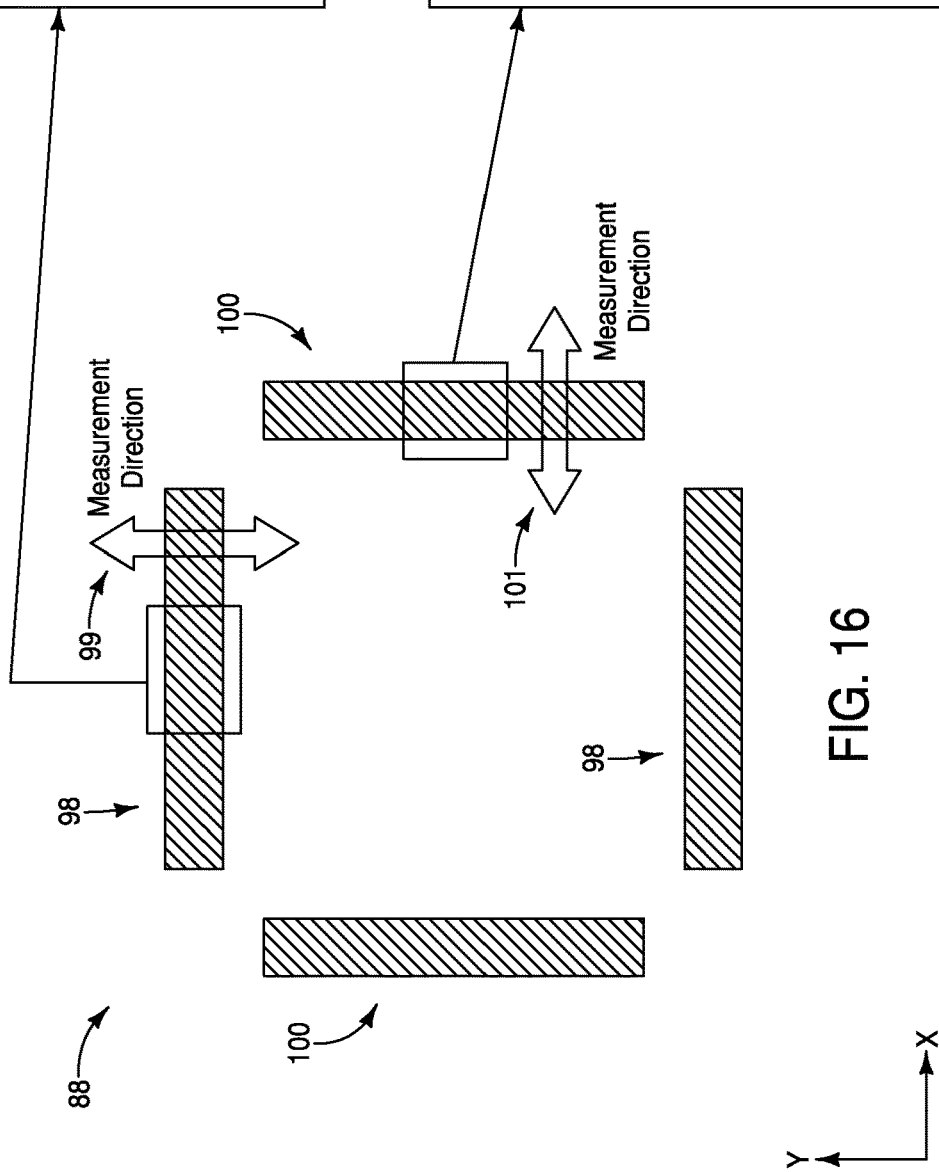
FIG. 16A
FIG. 16B
FIG. 16

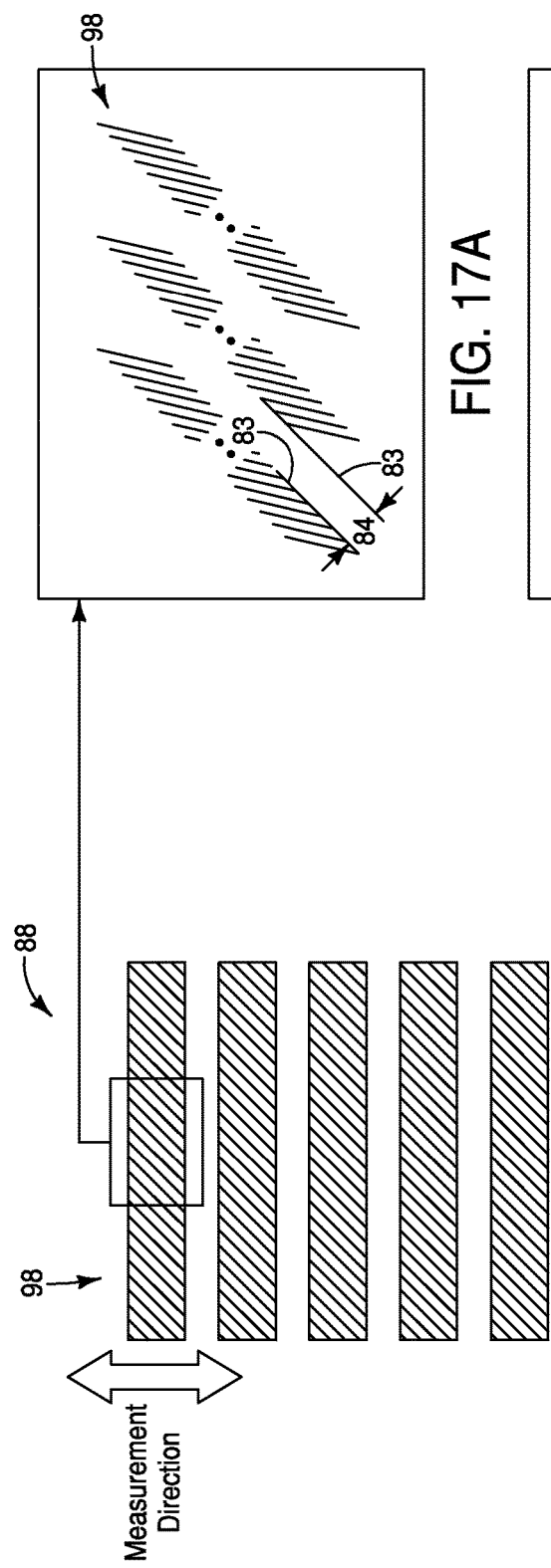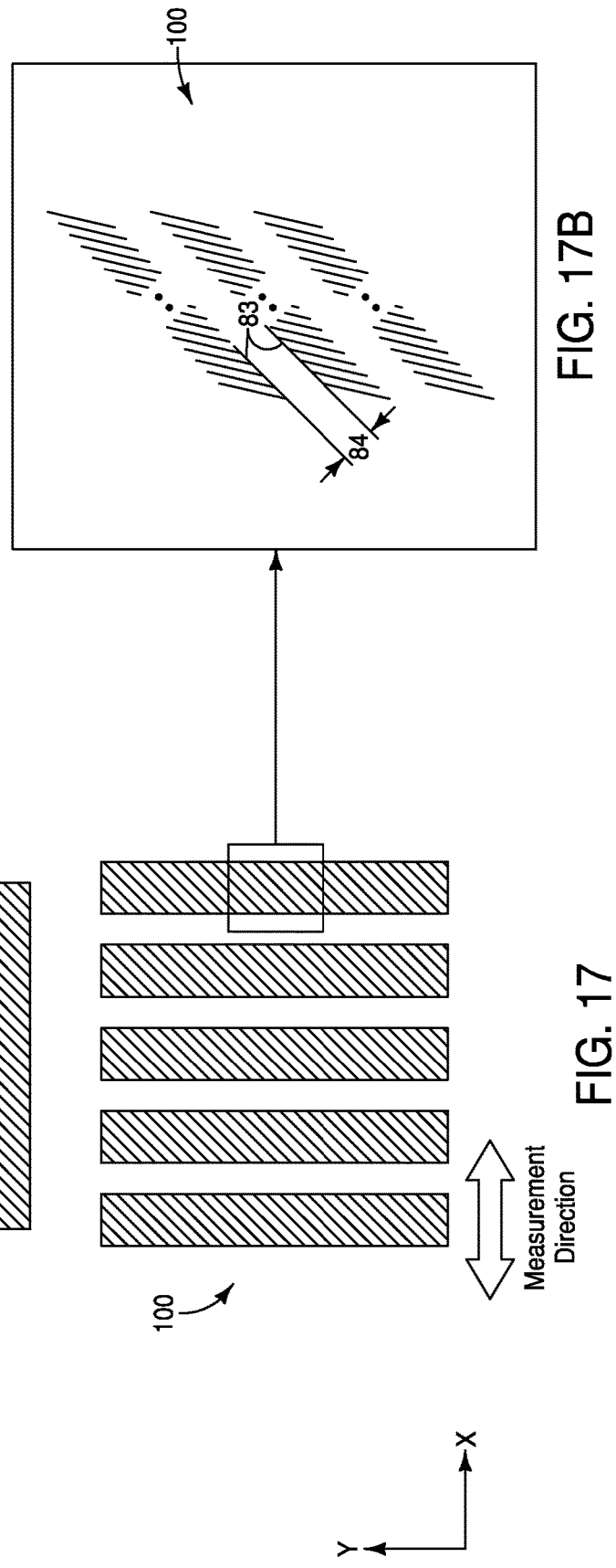
FIG. 17A
FIG. 17B
FIG. 17

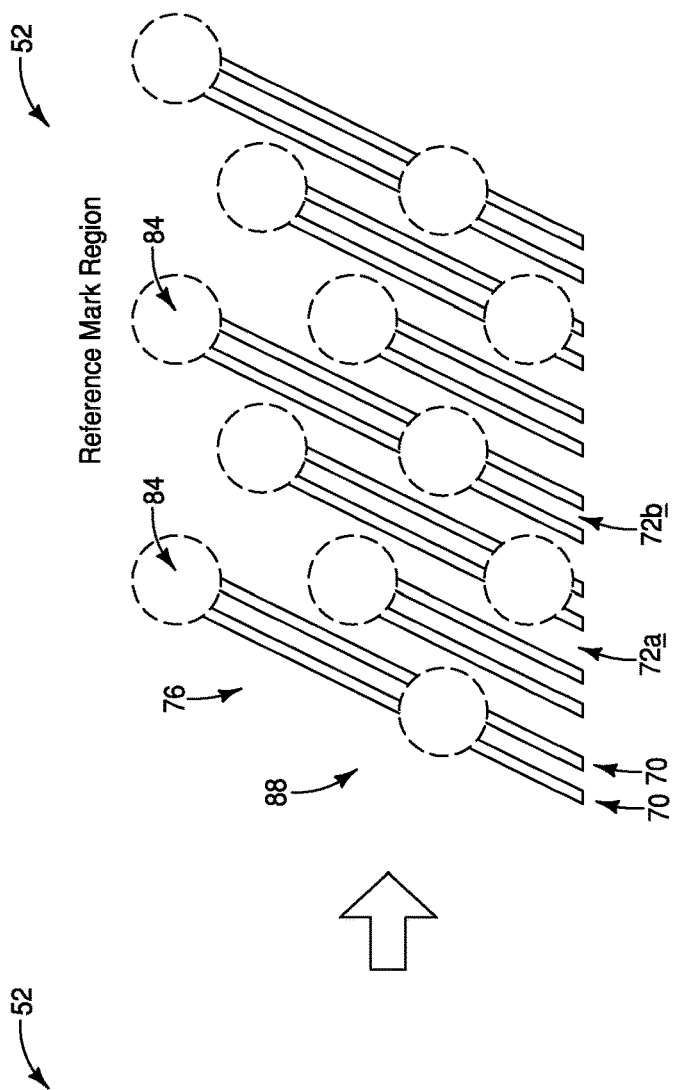
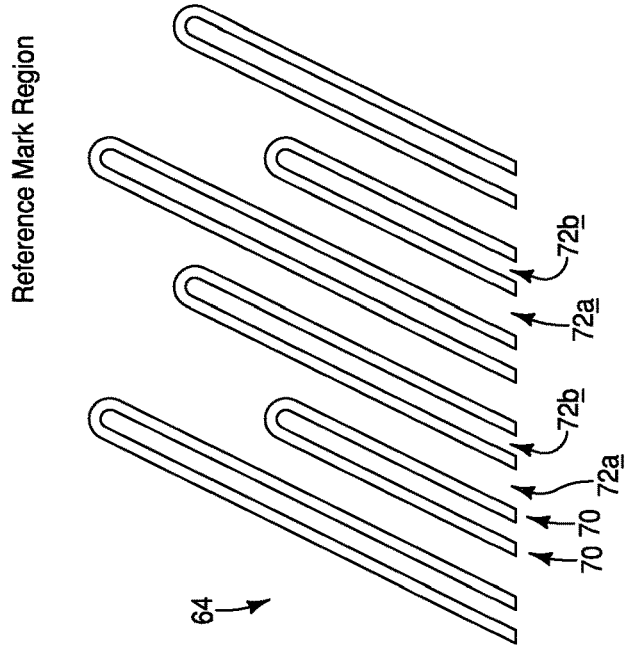
FIG. 22B
FIG. 22A

METHODS OF FORMING ALIGNMENT MARKS DURING PATTERNING OF SEMICONDUCTOR MATERIAL

TECHNICAL FIELD

Methods of forming alignment marks during patterning of semiconductor material.

BACKGROUND

Semiconductor memory (e.g., dynamic random-access memory, DRAM) may be configured in an array which comprises an x-axis direction (i.e., row direction) and a y-axis direction (i.e., column direction). Wordlines may extend along the row direction, and bitlines may extend along the column direction.

The semiconductor memory (i.e., integrated memory) may include active regions configured as pedestals, with such pedestals being slanted relative to the x and y axes. The pedestals may be fabricated with two sets of patterns, and each set may be slanted relative to the x and y axes. If deviation in alignment between the two sets of patterns occurs, the shape of one or more of the active regions will change relative to a desired shape. This may alter performance characteristics of the altered active regions. Additionally, or alternatively, undesired alteration of the shapes of the active regions may complicate the alignment of the wordlines and/or the bitlines with the active regions.

It is desired to develop new methods for patterning components which may be slanted relative to the x and y axes of a memory array. In some applications, it is desired to develop new methods for patterning active regions of a DRAM array.

BRIEF DESCRIPTION OF THE DRAWINGS

FIG. 4 is a diagrammatic top view of an example assembly comprising patterned semiconductor material.

FIG. 5 is a diagrammatic top view of a portion of an example memory array comprising patterned semiconductor material.

FIGS. 11A and 11B are diagrammatic top views of patterned marks in a reference region (FIG. 11A) and a memory cell region (FIG. 11B) at an example process stage.

FIG. 15 is a diagrammatic top view of an overlay pattern juxtaposed with a patterned component mark, and FIG. 15A is a diagrammatic cross-sectional side view along the line A-A of FIG. 15.

FIG. 16 is a diagrammatic top view of an overlay pattern. FIGS. 16A and 16B are enlarged views of regions of the overlay pattern of FIG. 16.

FIG. 17 is a diagrammatic top view of an overlay pattern. FIGS. 17A and 17B are enlarged views of regions of the overlay pattern of FIG. 17.

FIGS. 22A and 22B are diagrammatic top views of patterned marks in a reference region at an initial process stage (FIG. 22A) of an example embodiment, and a subsequent process stage (FIG. 22B) of the example embodiment.

DETAILED DESCRIPTION OF THE ILLUSTRATED EMBODIMENTS

Some embodiments include methods in which structures (e.g., active regions) are formed to be slanted relative to the x and y axes of a memory array. The structures are formed utilizing at least two patterned sets. One of the patterned sets includes first lines which are spaced from one another by first spaces. The first lines are slanted relative to the x and y axes. The first spaces are utilized to pattern trenches extending into an underlying material (e.g., a semiconductor substrate), and to thereby pattern the underlying material into rails. A first set of registration marks is formed to extend parallel with the first lines, and to extend across an alignment region. The second patterned set includes spaced-apart first openings over the rails. Such first openings are extended into the rails to subdivide the rails into the structures which are slanted relative to the x and y axis. Second openings are formed across the alignment region, and the second openings are aligned with the first openings. The second openings subdivide the registration marks to form an overlay pattern. In subsequent processing, features (e.g., wordlines, bitlines, etc.) may be formed to be aligned with the structures. The features may be formed along the memory array, and may be aligned with component marks formed adjacent the overlay pattern. The juxtaposition of the component marks relative to the overlay pattern may indicate the alignment of the features relative to the slanted structures; which may enable an operator to readily ascertain if appropriate alignment has been achieved. Example embodiments are described with reference to FIGS. 1-29.

Figure 1:
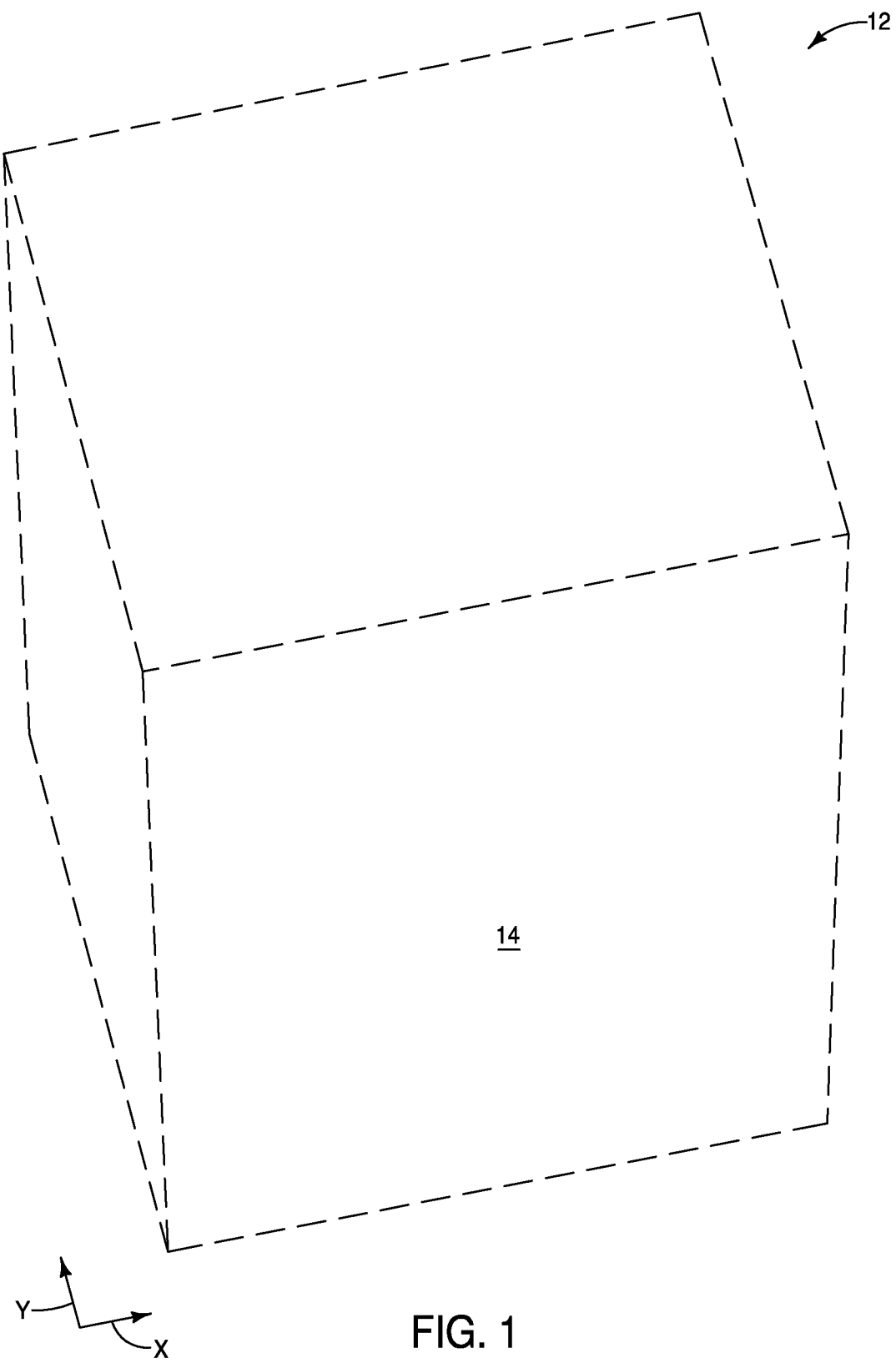
FIGS. 1-3 are diagrammatic three-dimensional views of a construction at example process stages of an example method for patterning semiconductor material.

Referring to FIG. 1, a portion of a semiconductor mass 12 is illustrated. The semiconductor mass may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The semiconductor mass 12 comprises semiconductor material 14. Such material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor mass 14 may comprise, consist essentially of, consist of silicon; such as, for example, monocrystalline solution.

An x/y axis system is provided adjacent to the mass 12. Ultimately, a region of the mass 12 may be incorporated into a memory array, with such memory array being laid out along the x/y axis system.

Figure 2:
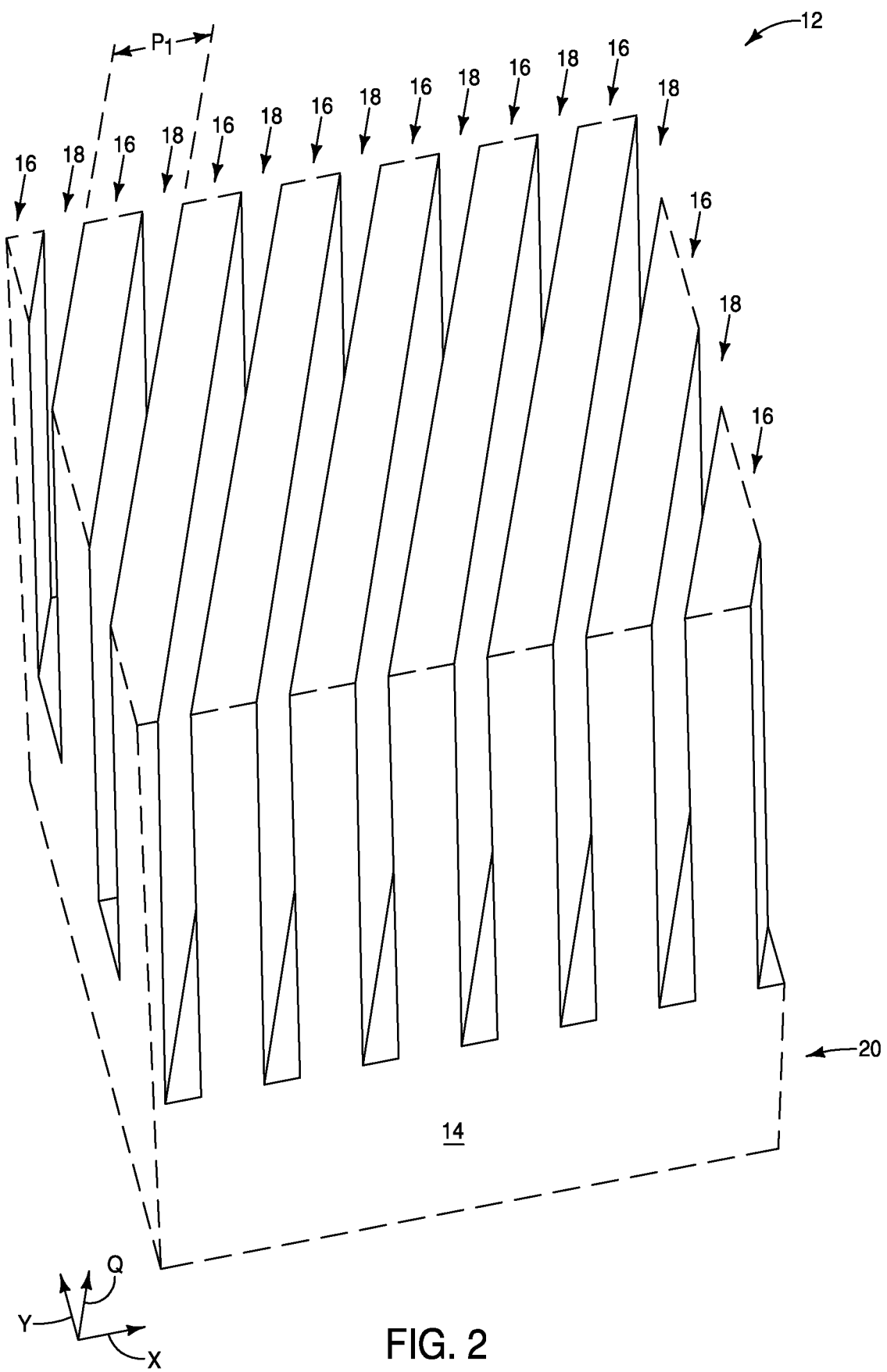

Referring to FIG. 2, the mass 12 is patterned to form rails 16 extending along a first direction represented by an axis Q, with such first direction being slanted relative to the x and y axes. The rails are spaced from one another by trenches 18 which extend into the semiconductor material 14, and which are elongated along the first direction represented by the axis Q. The rails 16 are supported by a base region 20 of the semiconductor material 14.

The rails 16 may be patterned by forming lines of masking material (not shown in FIG. 2) across regions of the mass 12, while leaving other regions unprotected by the masking material. The trenches 18 may be etched into the unprotected regions, and then the masking material may be removed to leave the configuration shown in FIG. 2. In subsequent processing, insulative material may be provided within the trenches 18.

Figure 3:
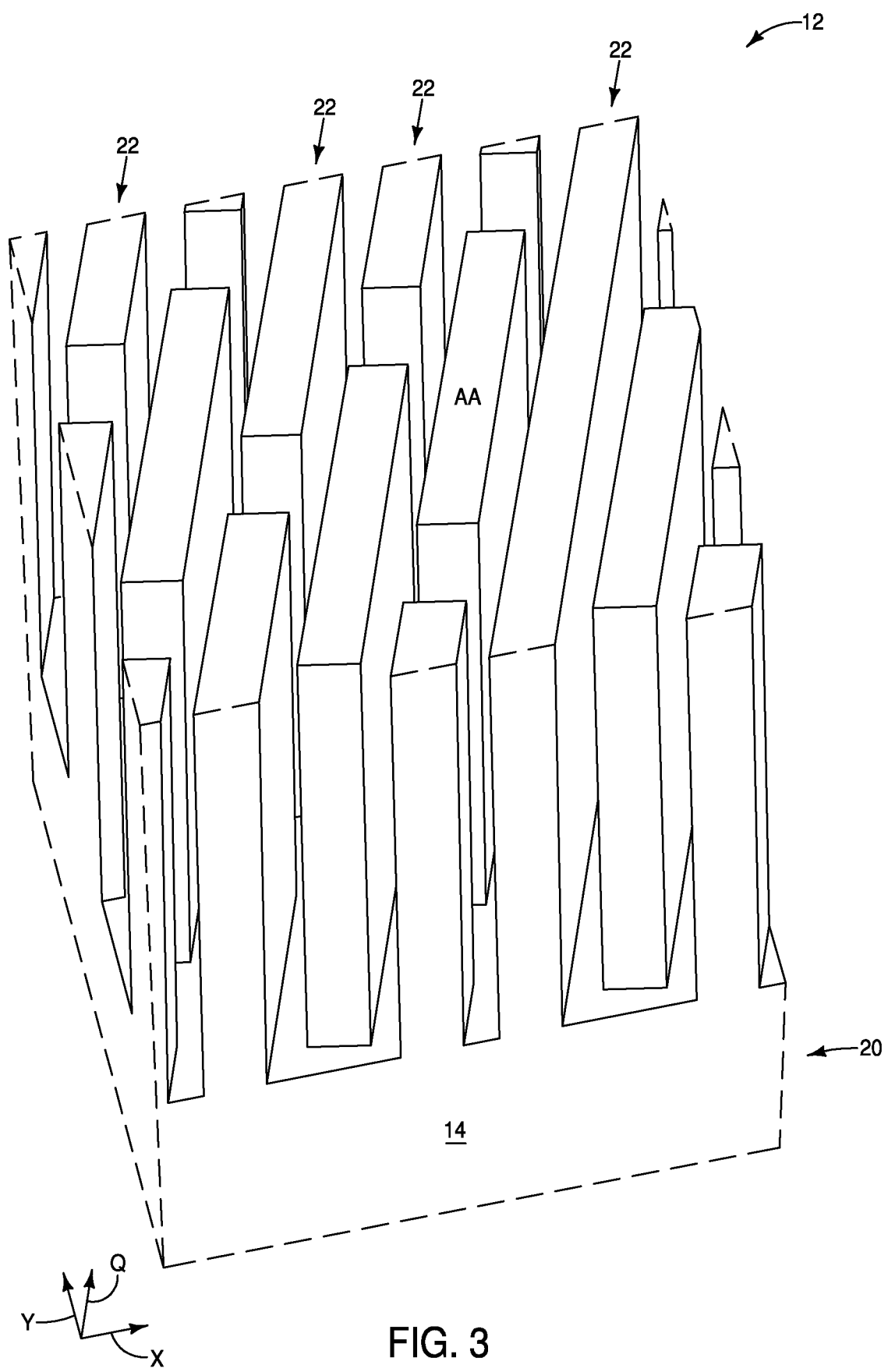

Referring to FIG. 3, the rails 16 (FIG. 2) are patterned into islands 22 (only some of which are labeled). The islands 22 correspond to pillars extending upwardly from the base 20. The islands 22 may comprise active areas (AA) of memory devices, and in some embodiments may be considered to be configured as active-region-pillars extending upwardly from the base 20. Only one of the pillars is labeled AA, but it is to be understood that each of the pillars may include an active area.

FIG. 3 shows the islands 22 in isolation from insulative material. In practice, insulative material would be provided within the trenches 18 of FIG. 2, then the rails 16 of FIG. 2 would be patterned into the islands 22, and then additional insulative material would be provided between the islands so that the islands would be entirely surrounded by insulative material.

Referring to FIG. 4, a construction (assembly) 10 is shown in top view at a processing stage analogous to that of FIG. 3, and with insulative material 24 provided between the active-region-pillars 22 (only some of which are labeled). The insulative material 24 may comprise any suitable composition(s); and in some embodiments may comprise, consist essentially of, or consist of silicon dioxide.

Referring to FIG. 5, the active-region-pillars 22 may be incorporated into a memory array 26. The pillars 22 are shown in dashed-line (phantom) view to indicate that such pillars are beneath other materials relative to the construction of FIG. 5.

Wordlines WL1-WL4 extend across the active-region-pillars 22 and subdivide the active regions into capacitor-contact regions 28 and bitline-contact regions 30. The wordlines extend along the x-axis direction; and in some embodiments such x-axis direction may be referred to as a row direction of the memory array 26.

Bitlines (digit lines) DL1-DL4 extend along the y-axis direction; and in some embodiments such y-axis direction may be referred to as a column direction of the memory array 26. The bitlines are coupled with the bitline-contact-regions 30 of the active-region-pillars 22. In the shown embodiment, openings 34 (only some of which are labeled) are diagrammatically illustrated to extend from bottom surfaces of the bitlines (e.g., DL1) to the bitline-contact-regions 30. The bitlines (e.g., DL1) may be coupled to the bitline-contact-regions 30 through conductive interconnects provided within the openings 34.

Each of the capacitor-contact-regions 28 is coupled with a capacitor 36 (only one of which is labeled). Each capacitor has a note coupled with a reference voltage 37. Such reference voltage may be any suitable voltage including, for example, ground, Vcc/2, etc.

One of the active-region-pillars 22 of FIG. 5 is labeled as a pillar 22a so that it may be distinguished from the other active-region-pillars. The pillar 22a is shown in three-dimensional view in FIG. 6. The wordlines WL2 and WL3 pass through the active-region-pillar 22a to subdivide an upper portion of the pillar into the bitline-contact-region 30, and the capacitor-contact-regions 28. The wordlines are shown to comprise conductive wordline material 38, and are shown to be spaced from the semiconductor material 14 of the active-region-pillar 22a by gate dielectric material 40.

The wordline material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The gate dielectric material 40 may comprise any suitable composition(s); and in some embodiments may comprise, consist essentially of, or consist of silicon dioxide.

Figure 6:
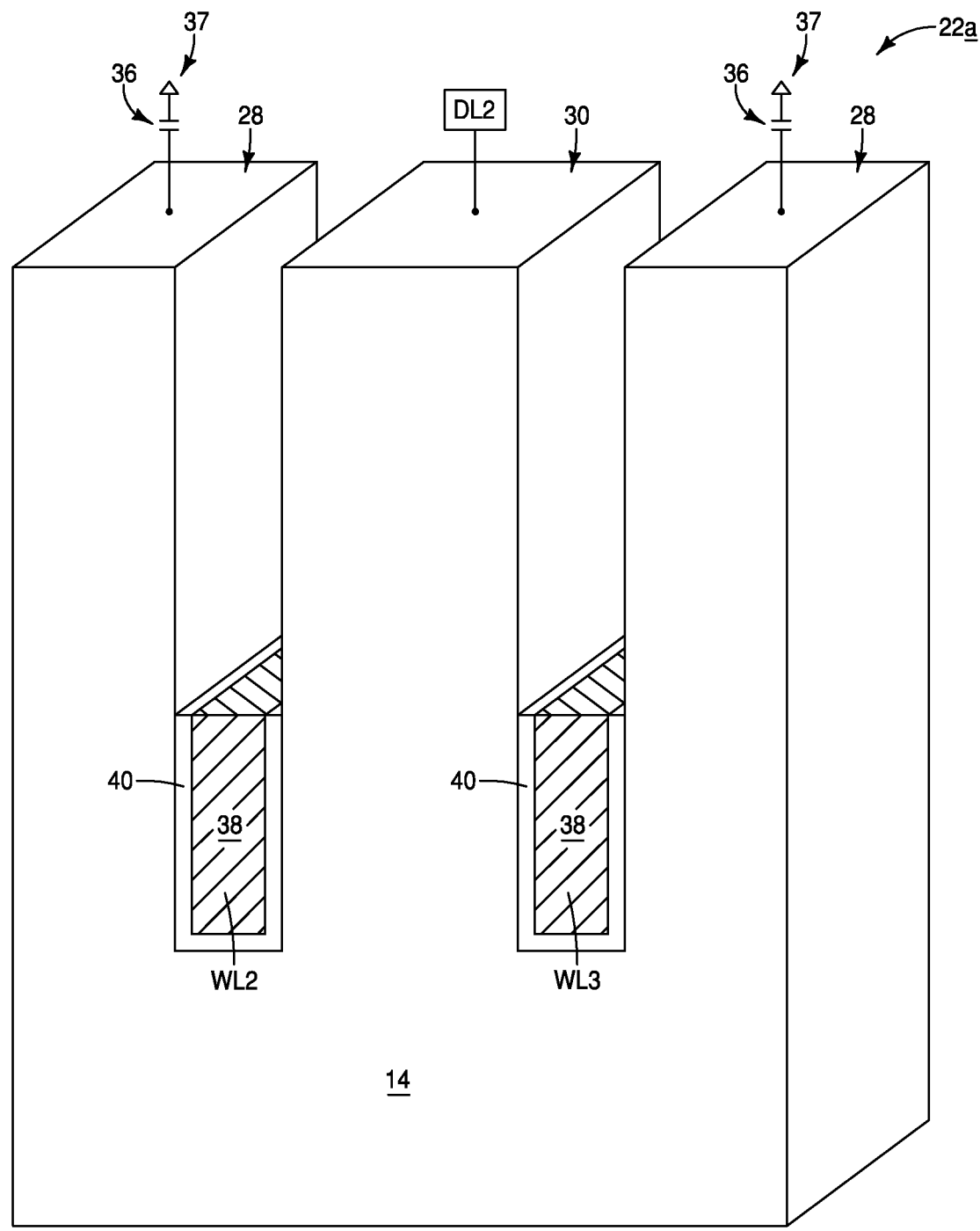
FIG. 6 is a diagrammatic three-dimensional view of a region of the example memory array of FIG. 5, and illustrates an example active-region-pillar.

The coupling of the bitline-contact-region 30 with the bitline DL2 is diagrammatically illustrated in FIG. 6, as are the couplings of the capacitor-contact-regions 28 with the capacitors 36. In practice, dopant would be provided within the regions 28 and 30 to form source/drain regions (not labeled), and channel regions (not labeled) would be formed within the pillar 22a and adjacent to the wordlines WL2 and WL3. Operation of the wordlines WL2 and WL3 may then be used to gatedly couple the source/drain regions to one another through the channel regions, and to thereby selectively couple with the digit line DL2 with one or the other of the capacitors 36 associated with the pillar 22a.

Figure 7A:
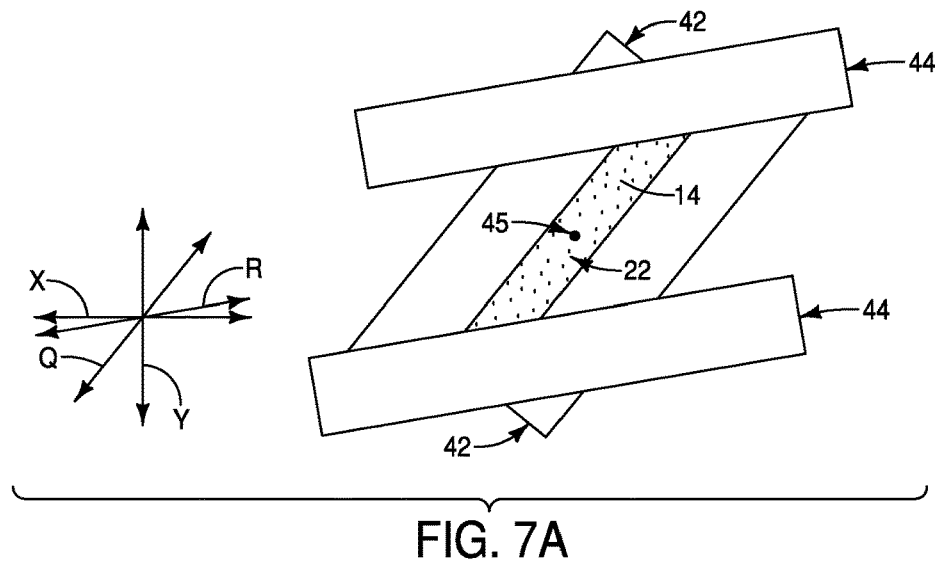
FIGS. 7A-7C are diagrammatic top views of assemblies illustrating example process stages which may be utilized for fabricating active-region-pillars.
Figure 7B:
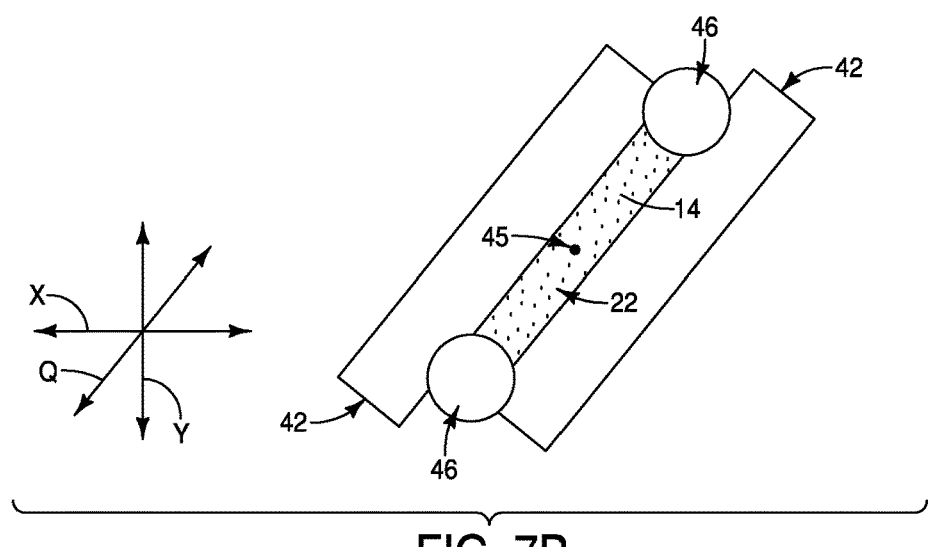
Figure 7C:
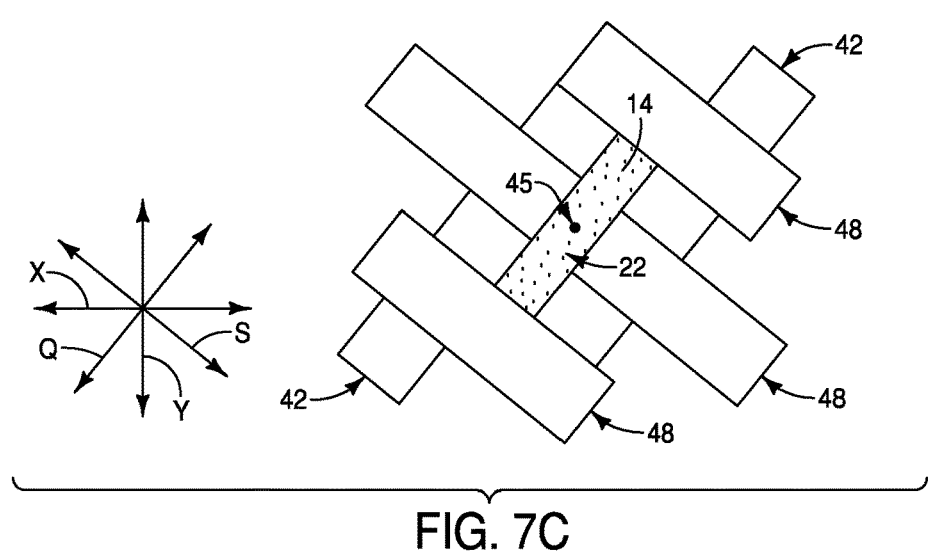

It can be difficult to fabricate the active-region-pillars 22 (e.g., the pillars 22 and 22a of FIGS. 3-6) off-axis relative to the x and y directions. Generally, at least two mask patterns are utilized. One of the mask patterns may be referred to as a first pattern set, and the other may be referred to as a second pattern set. FIGS. 7A-C illustrate example pattern sets which may be utilized to fabricate the active-region-pillars 22. The semiconductor material 14 of FIGS. 7A-C is stippled to enable the semiconductor material to be readily distinguished from patterns illustrated adjacent such semiconductor material.

Referring to FIG. 7A, a first pattern set comprises patterned trenches 42 which extend along the direction of the Q-axis, and which pattern the rails 16 of FIG. 2. A second pattern set comprises trenches 44 which extend along a direction of an R-axis. The second pattern set subdivides the rails 16 (FIG. 2) into the islands (active-region-pillars) 22 of FIG. 3. The trenches 42 of the first pattern set may be considered to extend along a first direction, and the trenches 44 of the second pattern set may be considered to extend along a second direction which crosses the first direction. In some embodiments, the trenches 42 of the first pattern set may be considered to correspond to B-chop regions, and the trenches 44 of the second pattern set may be considered to correspond to C-chop regions. In some embodiments, the patterned features 44 of the second pattern set may be referred to as openings, with the term "opening" being generic relative to trenches and other configurations that subdivide the features formed with the first pattern set (with example features formed by a first pattern set being the rails 16 of FIG. 2).

The patterned active-region-pillar 22 has a center 45. Such center may be eventually aligned relative to other components (e.g., wordlines, bitlines, etc.). If either the first pattern set or the second pattern set (e.g., either the set comprising trenches 42 or the set comprising trenches 44) is misaligned, the active-region-pillar 22 may be misshapen, and the center 45 may be shifted. It is desired to have a system which can indicate the alignment of the first and second pattern sets.

FIG. 7B shows an arrangement in which a first pattern set comprises the trenches 42 described above with reference to FIG. 7A, and a second pattern set comprises openings 46 provided to subdivide the rails 16 of FIG. 2 into the islands 22 of FIG. 3. In some embodiments, the trenches 44 of FIG. 7A may be considered to be examples of openings which are linearly elongated, and the openings 46 of FIG. 7B may be considered to be examples of openings which are not linearly elongated. In the embodiment of FIG. 7B, the openings 46 are circular-shaped. In other embodiments, the openings 46 may have other suitable shapes, such as, for example, elliptical shapes, square shapes, rectangular shapes, etc.

FIG. 7C shows an arrangement in which a first pattern set comprises the trenches 42 described above with reference to FIG. 7A, and a second pattern set comprises trenches 48 which extend along an S-axis direction. One of the second trenches 48 crosses over the active-region-pillar 22. Protective material (not shown) may be provided across a region of the active-region-pillar 22 so that the trench 48 is not etched into the pillar 22. The protective material may be referred to as protective blocking material. In some embodiments, the trenches 48 of FIG. 7C may be referred to as openings.

It is noted that even though trenches 42 of FIGS. 7A-7C are indicated to be formed prior to the openings 44, 46 and 48, in other embodiments such openings may be formed prior to the trenches 42.

Figure 8A:
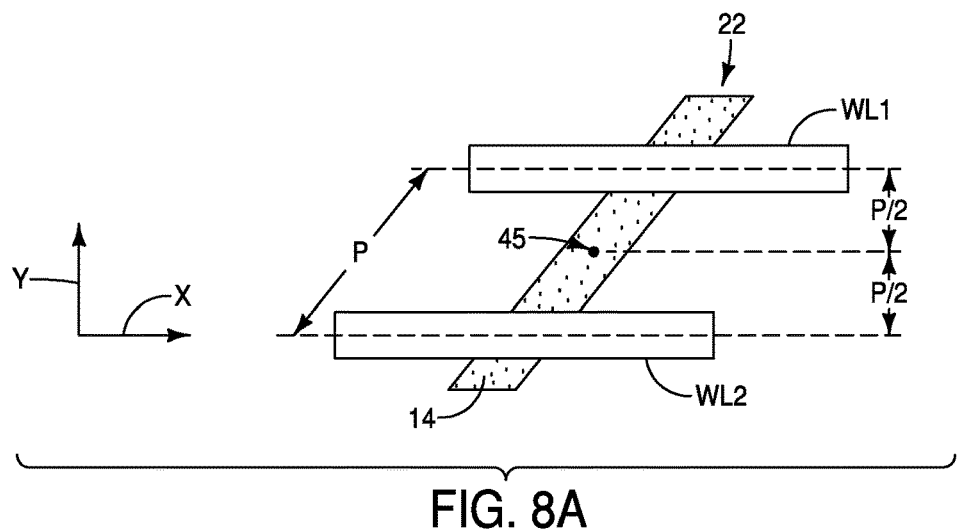
FIGS. 8A-8C are diagrammatic top views of assemblies illustrating example features formed proximate to active-region-pillars.
Figure 8B:
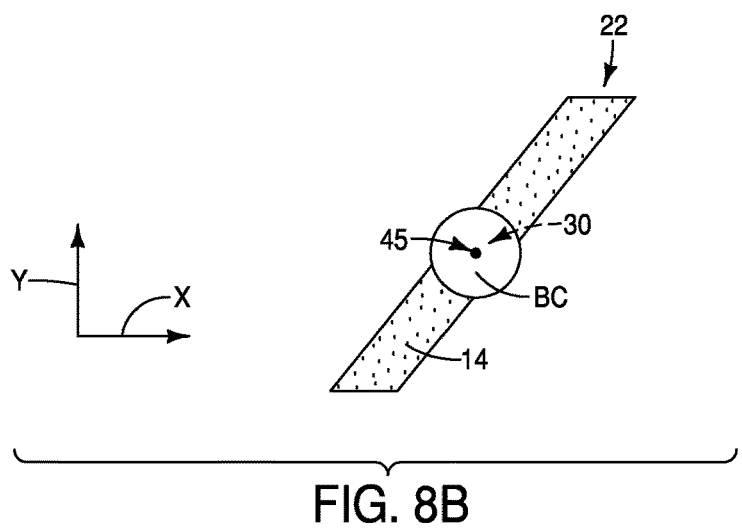
Figure 8C:
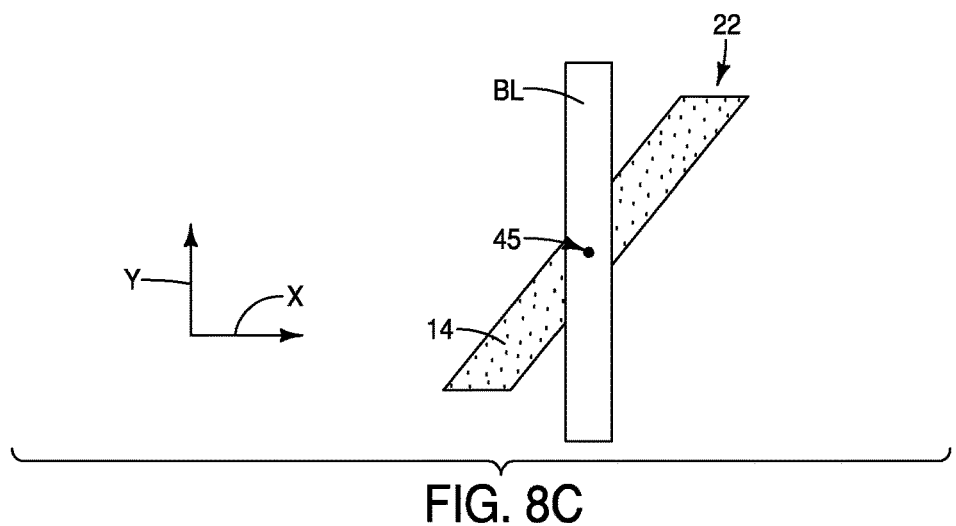

FIGS. 8A-8C show features aligned with the active-region-pillars 22.

FIG. 8A shows wordlines WL1 and WL2 extending across an active-region-pillar 22. The wordlines are on a pitch P, and are each intended to be spaced from the center 45 of the pillar 22 by a distance P/2. If the wordlines are misaligned, the operation of memory cells within a memory array may be affected. Accordingly, it would be desirable to have a system which can indicate the alignment of the wordline features relative to the active-region-pillars 22.

FIG. 8B shows a bit contact (BC) aligned with the center region 45 and extending to a bitline-contact-region 30 of the active-region-pillar 22. The bit contact may be formed within an opening which extends to the bitline-contact-region 30 (as discussed above with reference to FIG. 5, and illustrated with openings 34). If the bit contact is misaligned relative to the bitline-contact-region, the operation of memory cells within a memory array may be affected. Accordingly, it would be desirable to have a system which can indicate the alignment of the bit contacts to the active-region-pillars 22.

FIG. 8C shows a bitline (BL) aligned with the center region 45 of the active-region-pillar 22. If the bitline is misaligned, the operation of memory cells within a memory array may be affected. Accordingly, it would be desirable to have a system which can indicate the alignment of bitlines relative to active-region-pillars 22.

Figure 9:
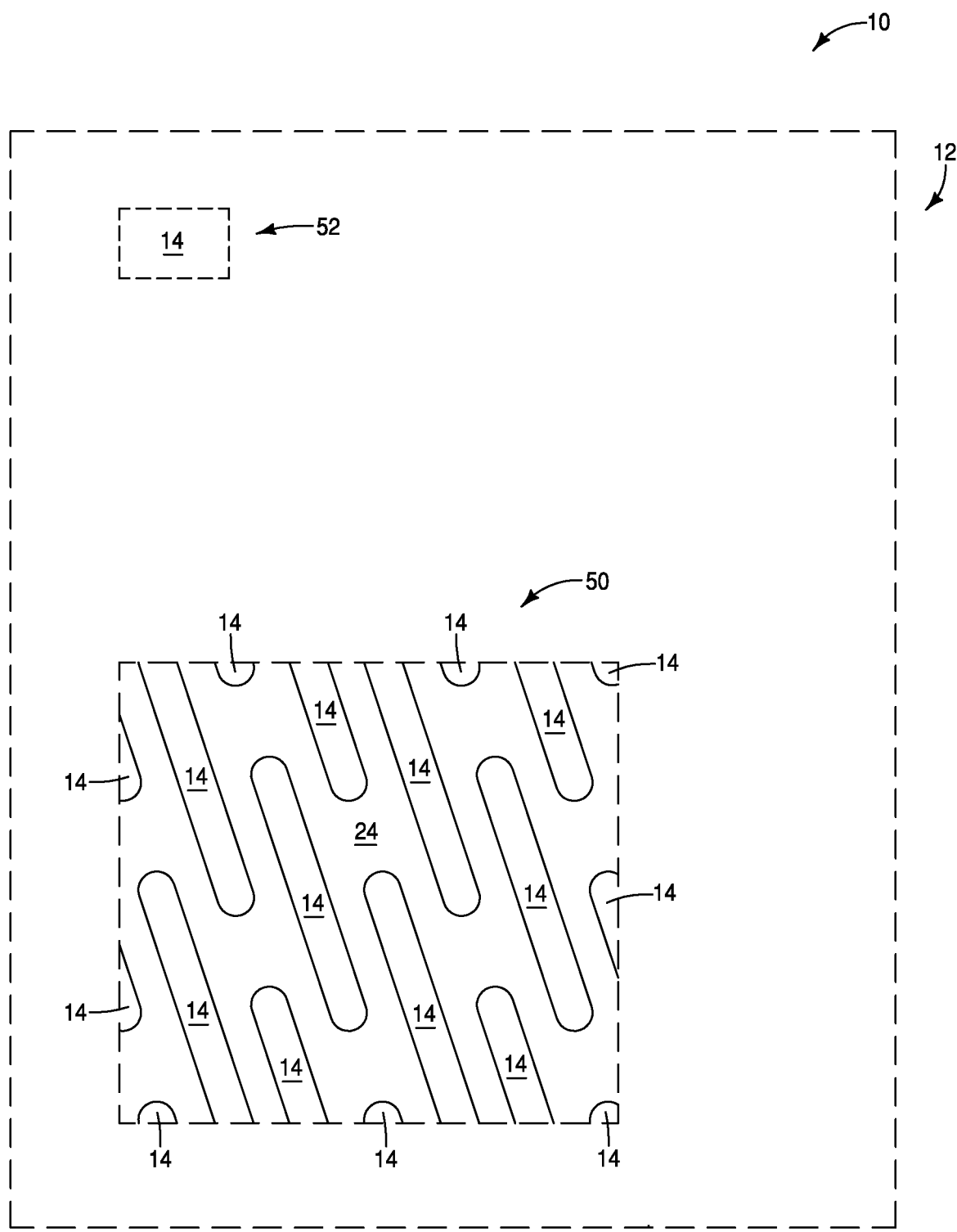
FIG. 9 is a diagrammatic top view of an example assembly comprising semiconductor material having a memory array region and an alignment mark region.

FIG. 9 shows a portion of a construction (assembly) 10. The construction 10 may comprise the semiconductor material 14 (described above with reference to FIGS. 1-6); and in some embodiments may comprise a memory array region 50 which encompasses a first region of the mass 12 (described above with reference to FIGS. 1-4), and may comprise a reference mark region (also referred to herein as an alignment mark region) 52 which encompasses a second region of the mass 12. The reference mark region 52 may be proximate the memory array region 50, and may be offset from the memory array region. In some embodiments, the reference mark region 52 may be in the so-called scribe line region of a semiconductor wafer, along which the wafer is diced and thus separated into individual semiconductor dies/chips each having the memory array region 50.

Figure 10A:
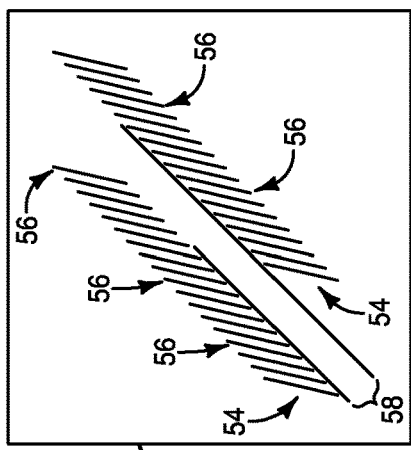
FIGS. 10A and 10B are enlarged views of regions of the reference mark of FIG. 10.
Figure 10B:
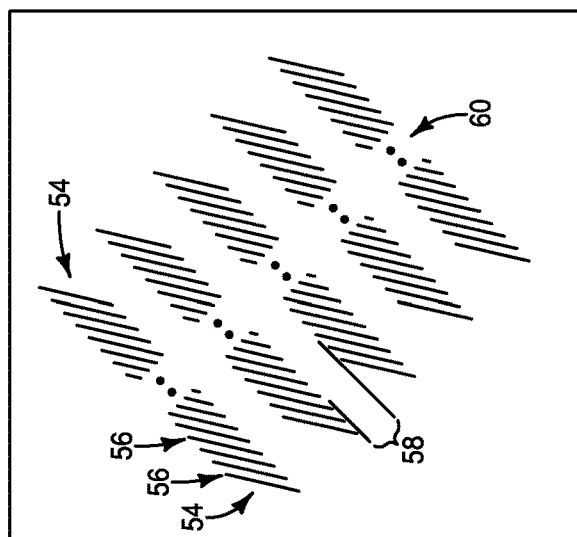
Figure 10:
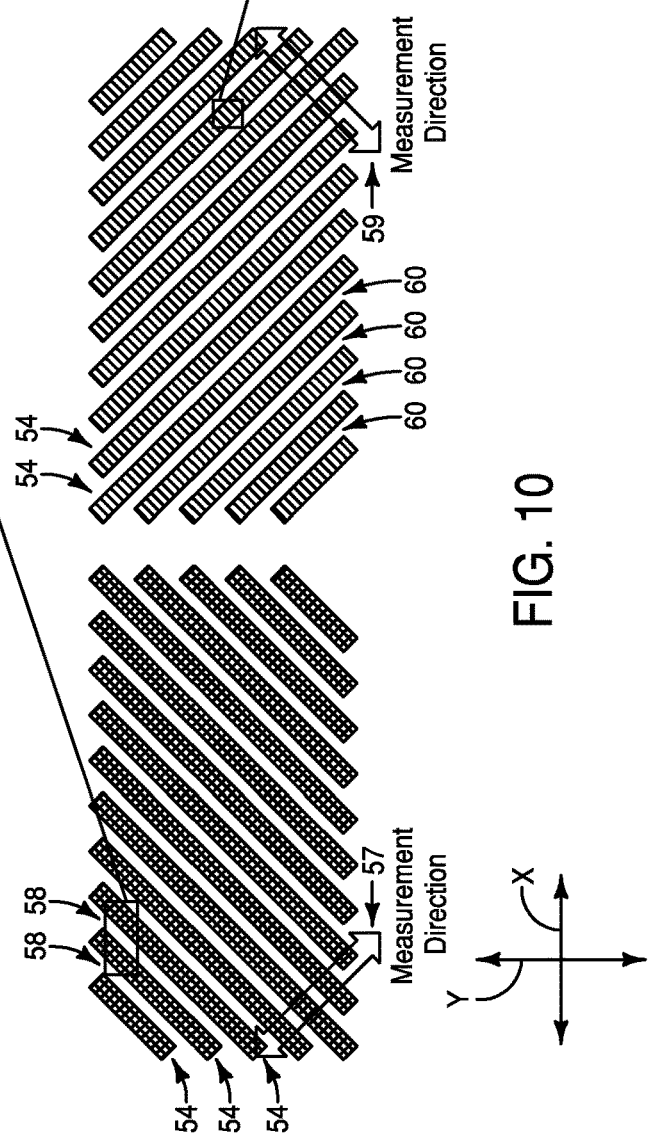
FIG. 10 is a diagrammatic top view of a reference mark as an overlay pattern.

Some embodiments pertain to methods of forming alignment marks (also referred to herein as reference marks) which are aligned with the trenches 42 and the openings (e.g., 44, 46 and 48) described above with reference to FIGS. 7A-7C. FIG. 10 shows reference marks 54 in which a first set of alignment (reference) features 54 on the left side of FIG. 10 extend rightward along a slant relative to the x and y axes, and a second set of alignment (reference) features on the right side of FIG. 10 extend leftward along another slant relative to the x and y axes. The alignment features 54 comprise alignment marks 56, as shown in the enlarged views of FIGS. 10A and 10B. The alignment marks 56 may be formed simultaneously with the trenches 42, as will be discussed in more detail below with reference to FIGS. 11 and 12. The alignment features 54 on the left side are spaced from one another by spacing regions 58. The features 54 on the right side are modified by slits 60 which extend along another slant relative to the x and y axes, and which intersect the features 54. The enlarged view of FIG. 10B shows the resulting pattern after the alignment features 54 are modified by the slits 60. The slits 60 may be formed simultaneously with the openings described above with reference to FIGS. 7A-7C as being utilized for subdividing rails into islands (i.e., the openings 44, 46 and 48). The pattern of FIG. 10B may be referred to as an overlay pattern. The alignment with the features 54 on the left side is measured in direction as indicated by a double-headed arrow 57, and the alignment with the features 54 on the right side is measured in direction as indicated by a double-headed arrow 59.

The overlay pattern of FIG. 10 may be formed within the reference mark region 52 of FIG. 9, and may be utilized for determining if active-region-pillars are formed in appropriate locations with appropriate shapes and/or for determining if active-region-pillars are appropriately aligned with other features (e.g., wordlines, bitlines, contact openings, etc.)

An example method for forming the reference mark pattern of FIG. 10 is described with reference to FIGS. 11 and 12.

Referring to FIGS. 11A and 11B, a first pattern set 62 is formed to extend across the memory array region 50 (which may also be referred to as a first region of an underlying mass of semiconductor material), and a third pattern set 64 is formed to extend across the reference mark region 52 (which may also be referred to as a second region of an underlying mass of semiconductor material). The first and second regions 50 and 52 are described above with reference to FIG. 9. In some embodiments, the pattern set 64 may be referred to as a second pattern set. However, it is useful to refer to the pattern set 64 as a third pattern set in order to distinguish it from a second pattern set that will be formed relative to the memory array region 50 at the processing stage of FIG. 12B.

In some embodiments, the region 50 may be considered to be generally representative of a region in which a circuit element is to be formed, and may be referred to as a "region for a circuit element". In such embodiments, the region 52 may be considered to be a region in which a reference mark is formed for alignment relative to the circuit element within the region 50.

Referring to FIG. 11B, the first pattern set 62 includes first patterning lines 66 (only some of which are labeled), which are spaced from one another by first trenches 68 (only some of which are labeled). The first trenches 68 may all be about the same width as one another (as shown), or some of the trenches may comprise different widths relative to others of the trenches. The term "about the same width" means the same width to within reasonable tolerances of fabrication and measurement. The lines 66 are on a pitch $P_1$, and extend along an angle $\theta 1$ relative to the x-axis. The angle $\theta 1$ is greater than 0° and less than 90°.

The lines 66 and spaces 68 may be considered to define a part of the memory array region 50 which will ultimately be used to fabricate circuit elements (e.g., active areas) slanted relative to the illustrated x and y axes. In some embodiments, the spaces 68 correspond to trenches which will be transferred into an underlying mass of semiconductor material to form the trenches 18 discussed above with reference to FIG. 2. The lines 66 may be referred to as first patterning lines.

Referring to FIG. 11A, the third pattern set 64 includes lines 70 (only some of which are labeled) and spaces 72. The spaces 72 may all be about the same width as one another (as shown); or at least some of the spaces may comprise different widths than at least some others of the spaces. The lines 70 are on a third pitch $P_3$. The pitch $P_3$ of the lines 70 across the reference mark region 52 may be the same as the pitch $P_1$ of the lines 66 across the memory array region 50, or may be different from the pitch $P_1$ while remaining proportional to the pitch $P_1$. In some embodiments, the pitch of the lines 70 may be referred to as a second pitch. However, it is useful to refer to the pitch of the lines 70 as a third pitch in order to distinguish it from a second pitch that will be formed relative to the memory array region 50 at the processing stage of FIG. 12B.

The lines 70 across the reference mark region 52 are parallel with the lines 66 across the memory array region 50. The third pattern set 64 (also referred to as a third set of patterns) may be formed simultaneously with the first pattern set 62 (also referred to as a first set of patterns); and accordingly, the lines 70 may be formed simultaneously with the lines 66. In some embodiments, the lines 70 may be referred to as alignment marks (or reference lines).

The lines 70 may be considered to define part of a reference mark (i.e., overlay pattern).

The lines 70 extend along a direction which is offset from the x-axis by the same angle $\theta 1$ as the lines 66 (i.e., extend along the same direction as the lines 66).

The trenches 68 and 72 may be considered to correspond to a B-chop pattern. Such trenches extend along a direction which is offset from the x-axis by the same angle $\theta 1$ as the lines 66 (i.e., extend along the same direction as the lines 66).

In some embodiments, the trenches 68 may be extended into underlying semiconductor material 14 to form the rails 16 and trenches 18 of FIG. 2 prior to the next processing stage described with reference to FIGS. 12A and 12B. The rails 16 will be on the first pitch $P_1$, as shown in FIG. 2. The alignment marks 70 of FIG. 11A will be parallel to the rails 16, and will be on the third pitch $P_3$ of FIG. 11A

Figure 12B:
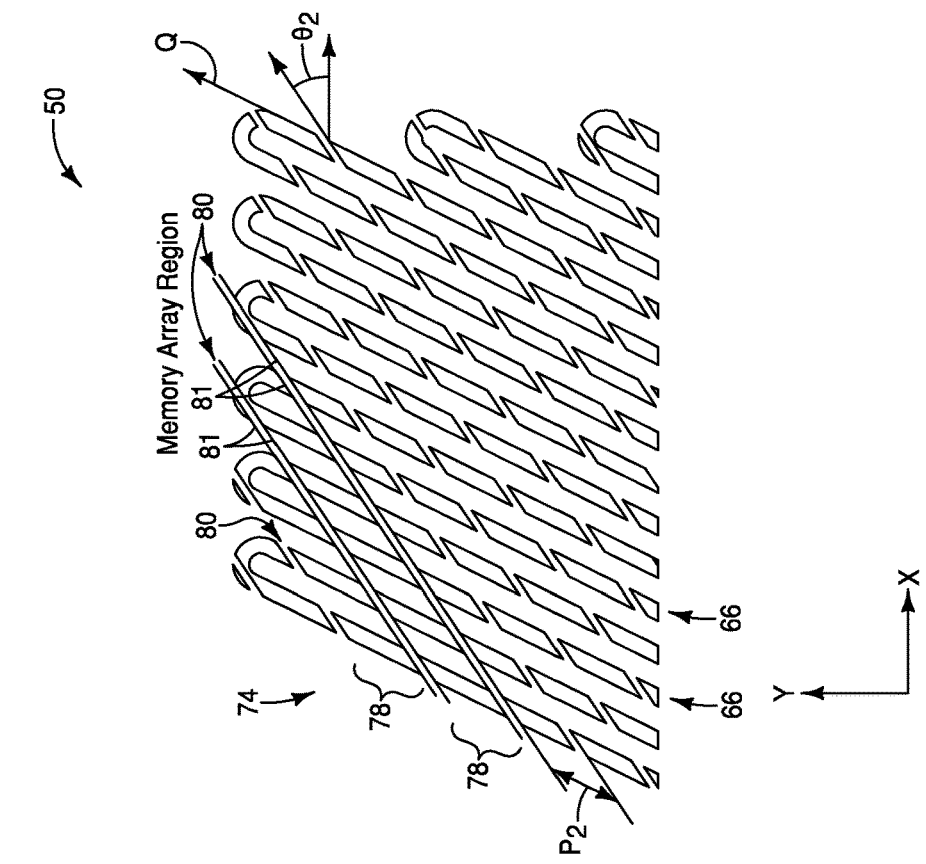
FIGS. 12A and 12B are diagrammatic top views of the patterned marks of FIGS. 11A and 11B at an example process stage subsequent to that of FIGS. 11A and 11B.
Figure 12A:
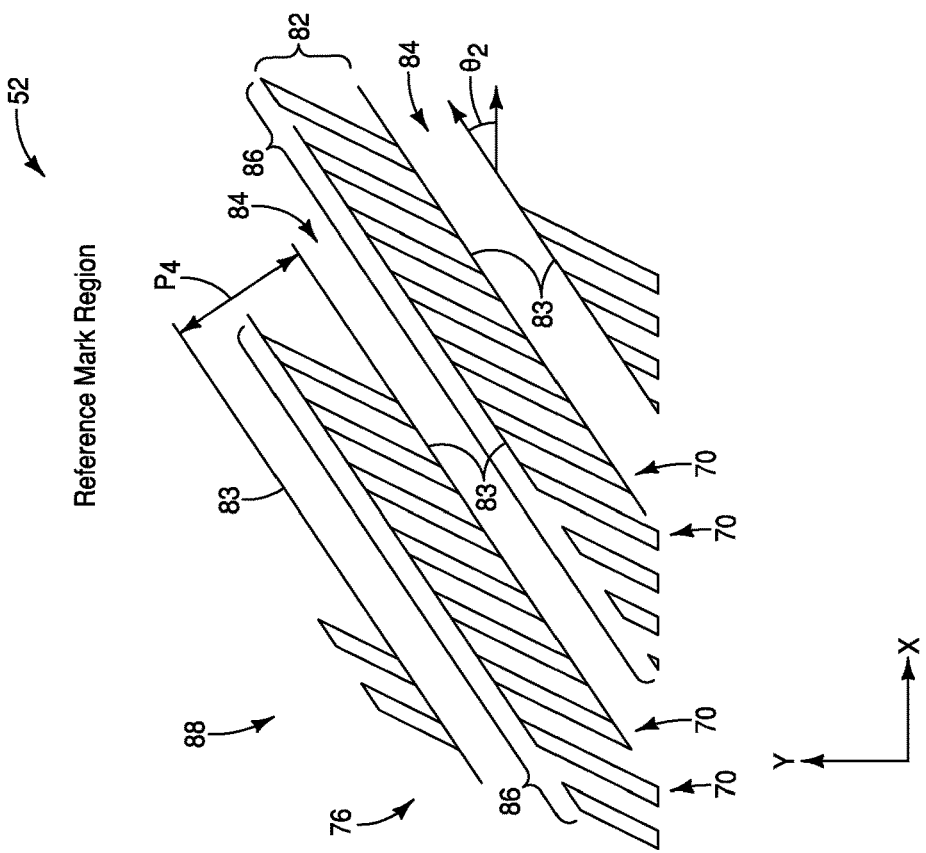

Referring to FIGS. 12A and 12B, a second pattern set 74 (also referred to as a second set of patterns) is formed to extend across the memory array region 50, and a fourth pattern set 76 (also referred to as a fourth set of patterns) is formed to extend across the reference mark region 52.

Referring to FIG. 12B, the second pattern set 74 includes second patterning lines 78 (only some of which are labeled), which are spaced from one another by openings 80 (only some of which are labeled). In the embodiment of FIG. 12B, the openings 80 are trenches, and may be referred to as second trenches to distinguish them from the first trenches 68 of FIG. 11B. In other embodiments, the openings 80 may have other shapes. Lines 81 are provided along a couple of the trenches 80 to assist the reader in visualizing the trenches. The lines 81 are not part of the second pattern 74, and would not actually be formed within the second pattern 74.

The lines 78 and trenches 80 are on a second pitch $P_2$, and extend along a second angle $\theta 2$ relative to the x-axis. The angle $\theta 2$ is greater than 0° and less than 90°, and in the shown embodiment is less than the first angle $\theta 1$.

The lines 78 and openings 80 may be considered to define a part of the memory array region 50 which will ultimately fabricate circuit elements (e.g., active areas) slanted relative to the illustrated x and y axes. In some embodiments, the openings 80 will be transferred into an underlying mass of semiconductor material at a processing stage subsequent to that of FIG. 2 to subdivide the rails 16 of FIG. 2 into the islands (active-region-pillars) 22 of FIG. 3.

The lines 78 and openings 80 of FIG. 12B intersect the lines 66 and openings 68 of FIG. 11B; and in some embodiments the second pattern set 74 of FIG. 12B may be considered to intersect the first pattern set 62 of FIG. 11B.

Referring to FIG. 12A, the fourth pattern set 76 includes lines 82 (only one of which is labeled) and openings (i.e., spaces, trenches, etc.) 84. The lines 82 and spaces 84 are on a fourth pitch $P_4$. The pitch $P_4$ of the lines 82 across the reference mark region 52 may be the same as the pitch $P_2$ of the lines 78 across the memory array region 50, or may be different from the pitch $P_2$ while remaining proportional to the pitch $P_2$.

In the embodiment of FIG. 12A, the openings 84 are trenches. In other embodiments, the openings 84 may have other shapes. The illustrated trenches may be referred to as linear openings to distinguish them from other types of openings which have non-linear shapes (e.g., circles, squares, elliptical-shapes, etc.). In some embodiments, the openings 80 of FIG. 12B may be referred to as first openings, and the openings 84 of FIG. 12A may be referred to as second openings. Lines 83 are provided along the trenches 84 of FIG. 12A to assist the reader in visualizing the trenches. The lines 83 are not part of the fourth pattern 76, and would not actually be formed with the fourth pattern 76.

The lines 82 across the reference mark region 52 are parallel with the lines 78 across the memory array region 50, and the trenches 84 across the reference mark region 52 are parallel with the trenches 80 across the memory array region 50. The fourth pattern set 76 (also referred to as a fourth set of patterns) may be formed simultaneously with the second pattern set 74 (also referred to as a second set of patterns); and accordingly, the openings 84 (e.g., the illustrated trenches 84) may be formed simultaneously with the trenches 80, and the lines 82 may be formed simultaneously with the lines 78. In some embodiments, the lines 82 may be referred to as alignment marks (or reference lines), and may be considered to define part of a reference mark (i.e., overlay pattern).

The lines 82 and trenches 84 extend along a direction which is offset from the x-axis by the same angle θ2 as the lines 78 and trenches 80 (i.e., extend along the same direction as the lines 78 and the trenches 80). FIG. 11A shows that the lines 70 of the pattern 64 extend along the first direction Q, and indicates that the lines 82 (FIG. 12A) of the pattern 76 extend along a second direction N; and that an angle θ3 between the first and second directions Q and N is less than 90°.

The trenches 80 and 84 may be considered to correspond to a C-chop pattern. Such trenches intersect the lines 66 and 70.

In some embodiments, the openings (trenches) 84 within the reference mark region 52 may be considered to subdivide the lines 70 (i.e., the first alignment marks, or the first reference lines) into sets 86. In some embodiments the openings 84 may be considered to be extended through the alignment marks 70 to transform the alignment marks 70 into an overlay pattern 88. In such embodiments, the fourth pattern set 76 of FIG. 12A may be considered to intersect the third pattern set 64 of FIG. 11A. Also, in such embodiments the lines 82 may be considered to be second reference lines formed across the reference mark region 52, and which are parallel with second patterning lines 78 formed across the memory array region 50.

In the illustrated embodiment, the third pattern set 64 of FIG. 11A has line ends 90, and the openings 84 of the fourth pattern set 76 remove such line ends. In some embodiments, the third pattern set 64 of FIG. 11A may be considered to have a second line-and-space pattern, while the first pattern set 62 of FIG. 11B has a first line-and-space pattern. The second line-and-space pattern includes the end regions (portions) 90. The fourth pattern set 76 of FIG. 12A may be considered to be disposed relative to the third pattern set 64 of FIG. 11A so that the respective end regions (portions) 90 are removed by the fourth pattern set 76.

In embodiments in which the first and third pattern sets 62 and 64 of FIGS. 11B and 11A are considered to be first and second line-and-space patterns, respectively; the second and fourth pattern sets 74 and 76 of FIGS. 12B and 12A may be considered to be third and fourth line-and-space patterns, respectively.

The embodiment of FIGS. 11 and 12 describes the formation of the first and third pattern sets 62 and 64 as being prior to the second and fourth pattern sets 74 and 76. In other embodiments, the second and fourth pattern sets 74 and 76 may be formed prior to the first and third pattern sets 62 and 64.

Figure 13B:
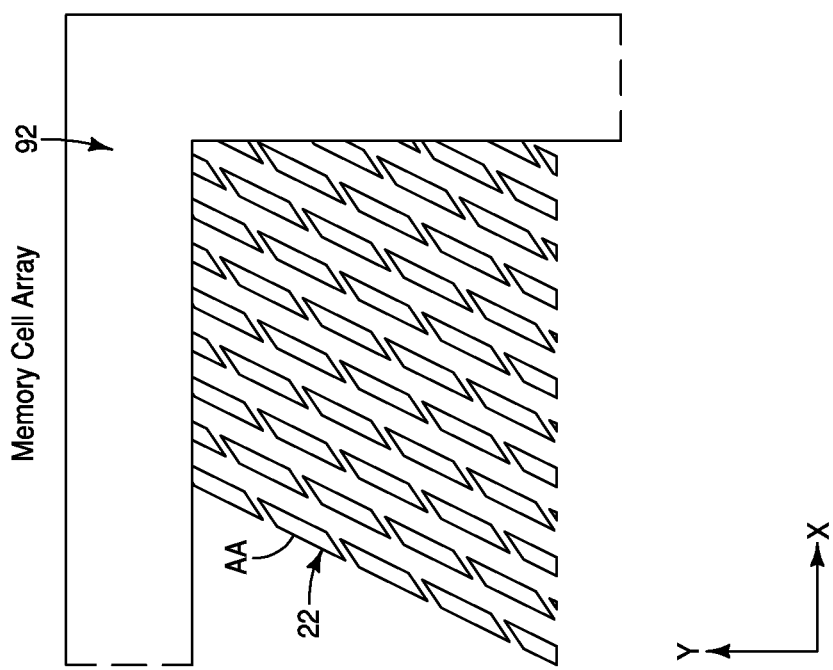
FIGS. 13A and 13B are diagrammatic top views of the patterned marks of FIGS. 11A and 11B at an example process stage subsequent to that of FIGS. 12A and 12B.
Figure 13A:
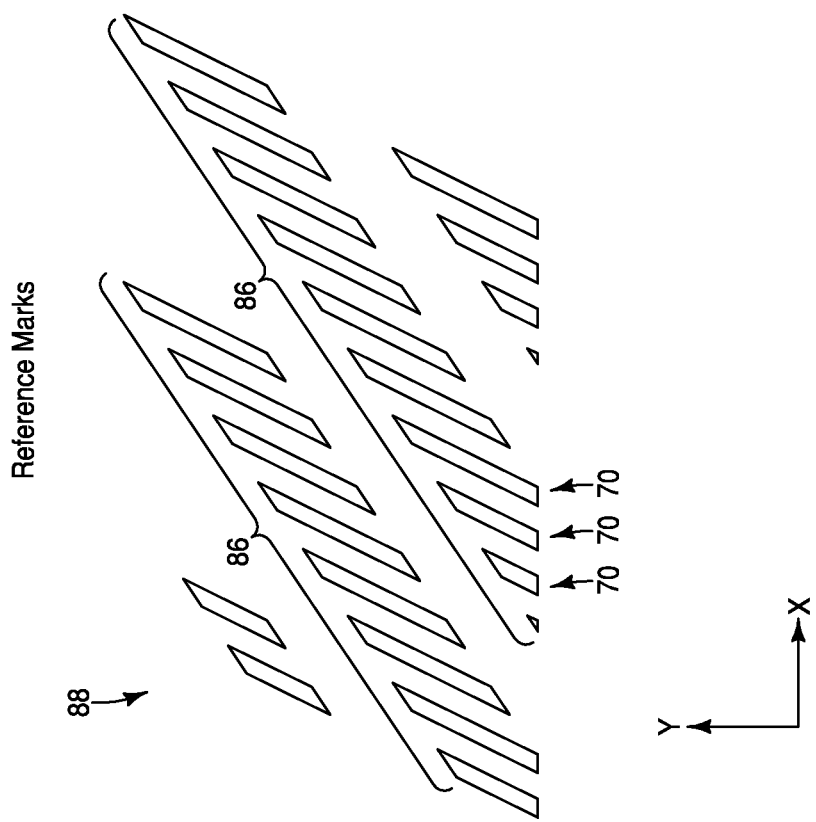

Referring to FIGS. 13A and 13B, another patterning step is utilized to pattern an array of components (e.g., active regions 22). The patterning step may utilize a trench 92, which may be referred to as a D-chop trench. The regions 22 may correspond to the structures 22 described above with reference to FIGS. 3 and 4; and may be incorporated into memory arrays of the type described with reference to FIGS. 5 and 6.

The overlay pattern 88 of FIGS. 12A and 13A may enable the alignment of the masking patterns of FIGS. 11B and 12B to be readily determined, which can enable prompt determination as to whether the structures 22 of FIG. 13B are formed within desired tolerances. Such can provide improvement over conventional processes, in that it can be time-consuming and inefficient in conventional patterning processes to determine if the structures 22 (i.e., structures slanted relative to x and y axes of a memory array) have configurations within desired tolerances. Another advantage of the overlay pattern 88 of FIGS. 12A and 13A is that such may be utilized to determine if features (e.g., wordlines, bitlines, bitline contacts, etc.) are aligned with the structures 22 to within desired tolerances.

Figure 14:
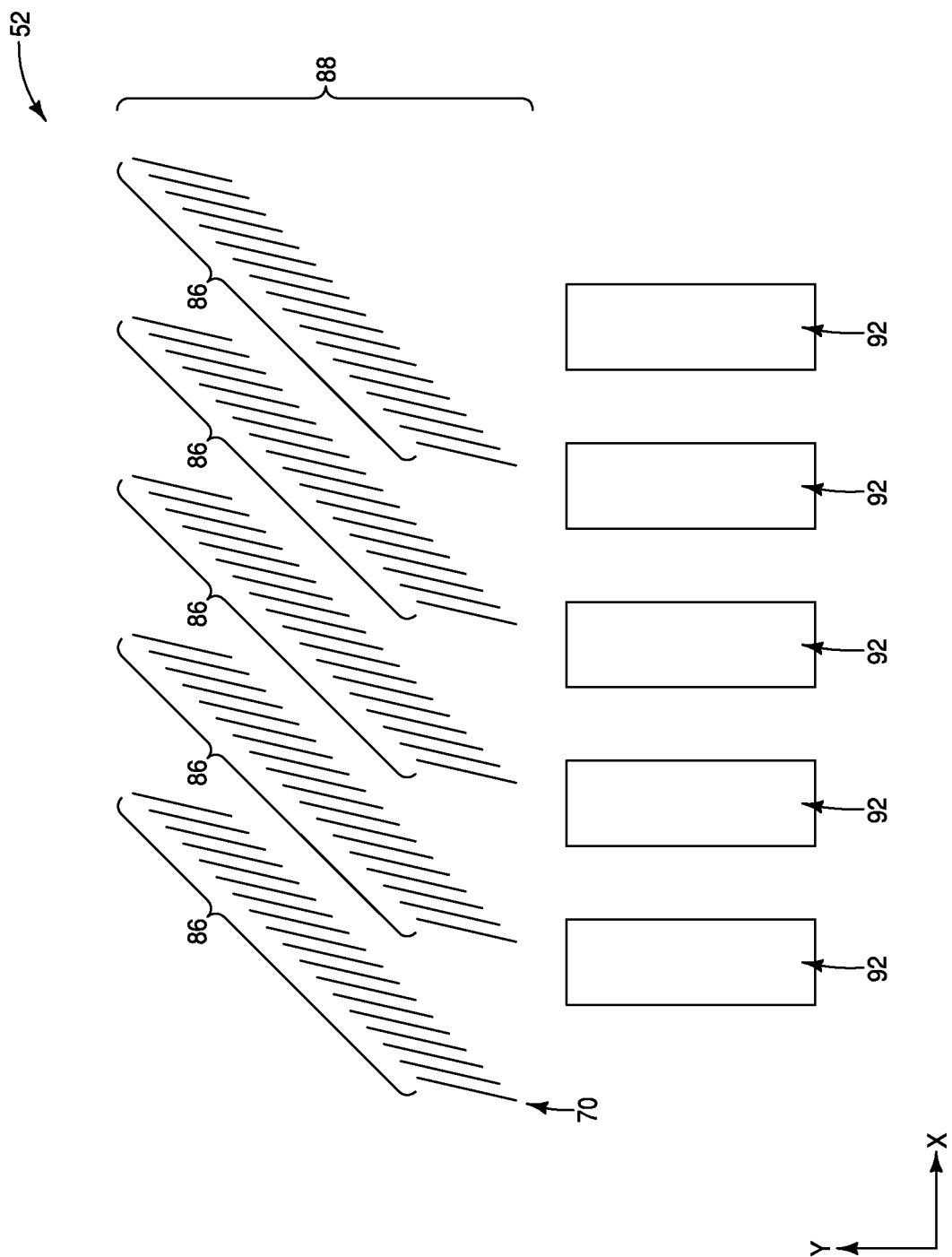
FIG. 14 is a diagrammatic top view of an overlay pattern juxtaposed with patterned component marks.

FIG. 14 shows a reference mark region 52 comprising a region of the overlay pattern 88, and comprising component marks 92 proximate the overlay pattern. The component marks may be aligned with features (e.g., bitlines, wordlines, bitline contacts, etc.) formed across the memory array region 50 (shown in FIG. 9). The alignment of the component marks with the features may be accomplished during patterning of the features. For instance, in some embodiments the features may correspond to wordlines of the type described in FIGS. 5 and 6 as wordlines WL1, WL2, etc. The component marks 92 may be formed during the patterning of the wordlines, and may be parallel to the wordlines. Similarly, the component marks 92 may be aligned with other features, such as bitlines (e.g., DL1, DL2, etc. of FIG. 5), bitline contacts (e.g., the contacts within regions 34 of FIG. 5), etc.

Each of the component marks 92 is juxtaposed relative to one of the sets 86 of the reference marks 70. The alignment of the component mark 92 with its juxtaposed set 86 can indicate relative alignment between the features (e.g., wordlines, bitlines, etc.) within the memory array region 50 (FIG. 9) and the structures 22 (FIG. 5) within such memory array region. In some embodiments, the component marks 92 may be referred to as comparison marks, the overlay pattern 88 may be referred to as comprising reference marks 70 within the sets 86; and the comparison marks 92 may be considered to be disposed relative to the reference marks 70. The memory array 26 of FIG. 5 may be considered to be a circuit element, the structure 22 may be considered to be a region of the circuit element, and the comparison mark may be considered to be associated with another region of the circuit element (e.g., a wordline region, bitline region, etc.).

FIG. 15 shows one of the component marks 92 juxtaposed with one of the sets 86 within the overlay pattern 88. The set 86 is similar in shape to the segment 22 (FIG. 13B, also FIG. 5). The set 86 may be referred to as a segment of an overlay pattern, a segment of an alignment pattern, a segment of a reference mark pattern, etc. Inspection of the alignment of the component mark 92 relative to the segment 86 readily indicates if there has been any deviation in alignment relative to the patterning steps of FIGS. 11 and 12 during fabrication of an example segment 22, and relative to the alignment of such segment 22 with respect to the patterned feature (wordline, bitline, bitline contact, etc.) represented by the component mark 92. In the illustrated embodiment, the component mark 92 may represent a bitline which is aligned with a center of the segment 86. The segment 86 may be compared with the component mark 92 by comparing a line passing through the center of the segment 86 with a line passing through the center of the component mark 92.

FIG. 15A diagrammatically illustrates a cross-section along the line A-A, and shows that the lines 76 of the segment 86 may be embedded within a supporting material 96 (e.g., silicon dioxide), and that the component mark 92 may be over the supporting material 96. The lines 76 may comprise any suitable material, and in some embodiments may comprise patterned semiconductor material, patterned insulative material, patterned conductive material, patterned photoresist, etc. The component mark 92 may comprise any suitable material, and in some embodiments may comprise patterned conductive material, patterned insulative material, patterned photoresist, etc.

FIG. 16 shows an overlay pattern 88 comprising laterally-extending regions (also referred to as horizontally-extending regions) 98, and longitudinally-extending regions (also referred to as vertically-extending regions) 100. The alignment within the laterally-extending regions 98 is measured longitudinally as indicated by a double-headed arrow 99, and the alignment within the longitudinally-extending segments 100 is measured laterally as indicated by a double-headed arrow 101.

FIG. 16A shows an enlarged view along one of the laterally-extending regions 98, and FIG. 16B shows an enlarged view along one of the longitudinally-extending regions 100. The gaps 84 are shown within FIGS. 16A and 16B, and the lines 83 are provided within such figures to assist the reader in visualizing the gaps 84.

FIG. 17 shows an overlay pattern 88 comprising another arrangement of laterally-extending regions 98, and vertically-extending regions 100. FIGS. 17A and 17B show enlarged views along one of the laterally-extending regions 98 and one of the longitudinally-extending regions 100, respectively.

Figure 18C:
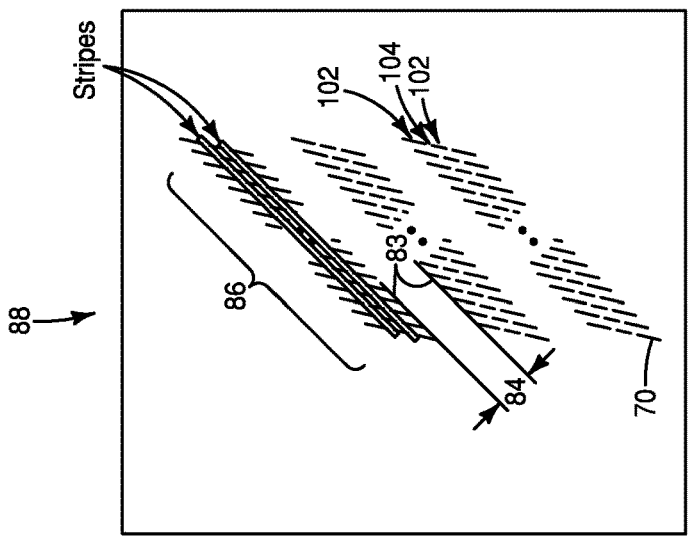
FIGS. 18A-18C are diagrammatic top views of example sets of reference marks within example overlay patterns.
Figure 18B:
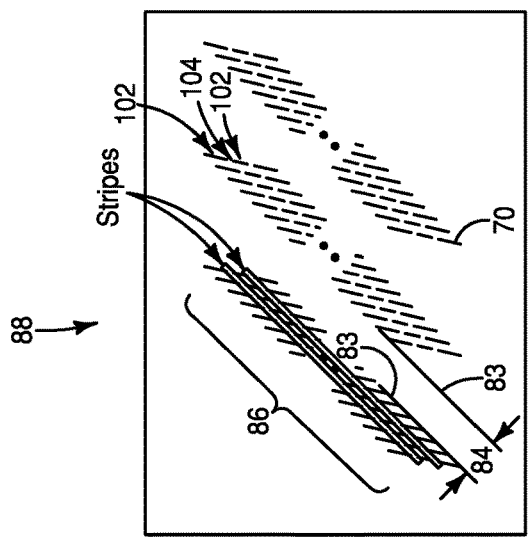
Figure 18A:
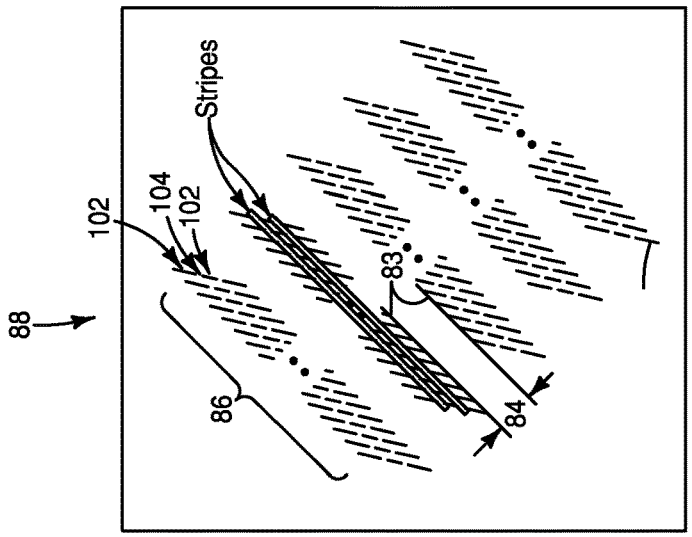

FIGS. 18A-C show regions of example overlay patterns 88. Each region comprises segments 86. Notably, each of the segments 86 comprises regions 102, and gaps (stripes) 104 between the regions 102. Some of the stripes are diagrammatically illustrated with boxes, but it is to be understood that such boxes are provided to assist the reader in understanding the locations of the stripes and are not part of the actual pattern. The overlay patterns of FIGS. 18A-C may result from pitch-doubling (or other pitch-multiplication processes) being utilized during formation of the segments 22 and the overlay regions 88; and/or from processing analogous to that described below with reference to FIGS. 24-29. Pitch-multiplication processes are described in, for example, U.S. Pat. Nos. 8,389,383 and 8,852,851, and in U.S. patent publication number 2014/0091434.

Figure 19B:
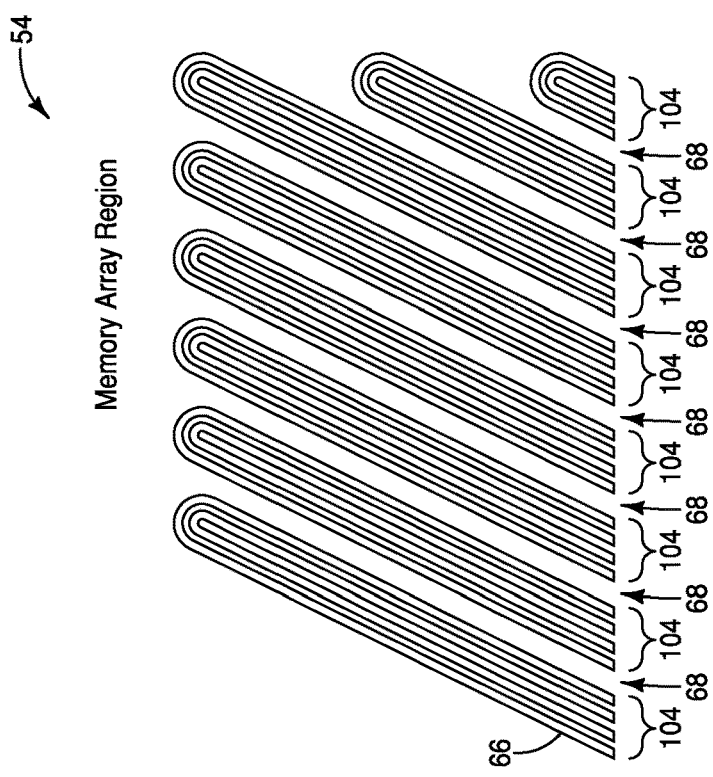
FIGS. 19A and 19B are diagrammatic top views of patterned marks in a reference region (FIG. 19A) and a memory cell region (FIG. 19B) at an example process stage.
Figure 19A:
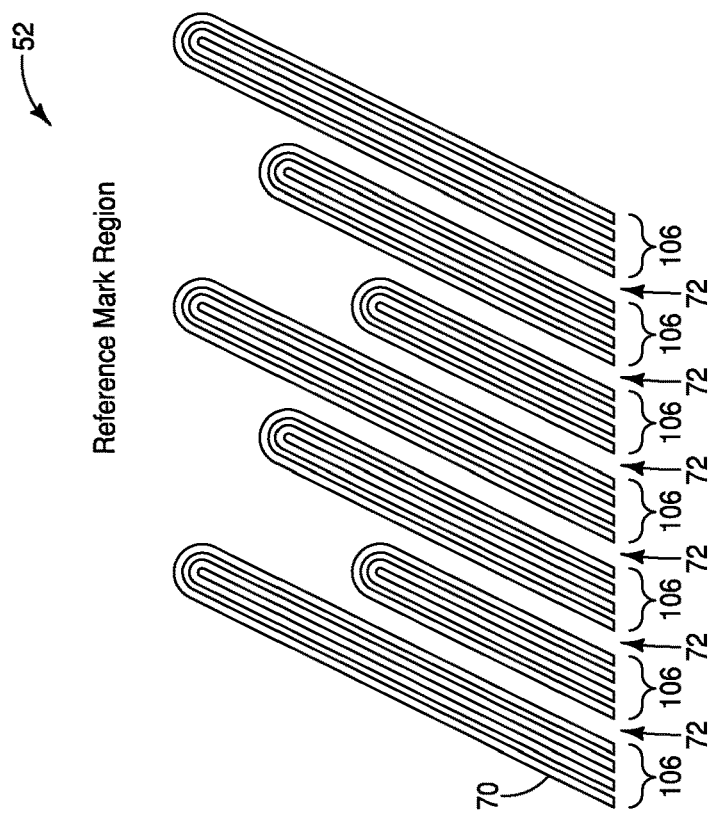

FIGS. 19A and 19B show a processing stage analogous to that described above with reference to FIGS. 11A and 11B. However, the processing stage of FIGS. 19A and 19B differs from that of FIGS. 11A and 11B in that the lines 70 and 66 of FIGS. 19A and 19B are incorporated into thick lines 106 and 104 formed with pitch-quadrupling processes. The pitch-quadrupling processes may include any suitable processes, including, for example, one or more processes analogous to those described in U.S. Pat. Nos. 8,389,383 and 8,852,851, and in U.S. patent publication number 2014/0091434.

Figure 20B:
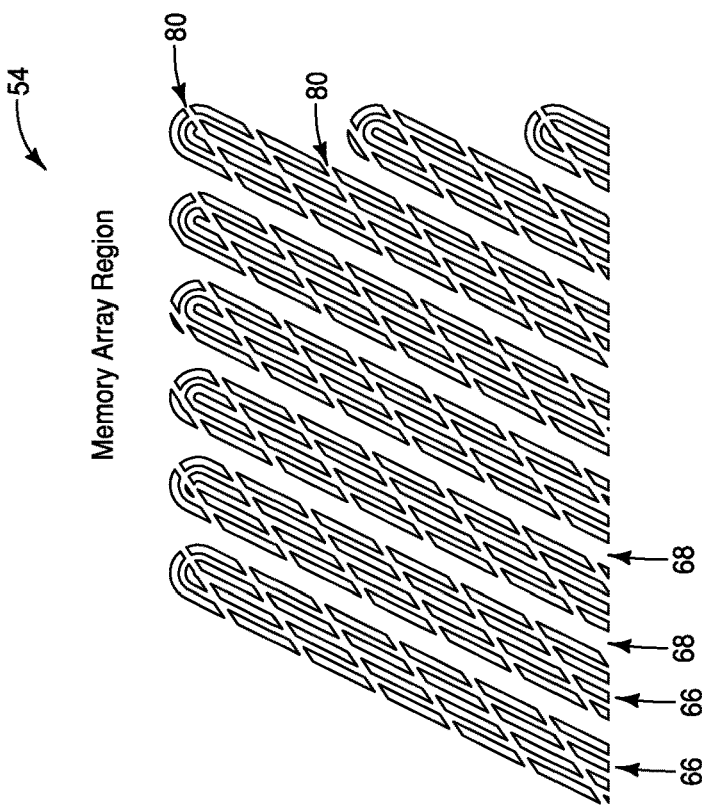
FIGS. 20A and 20B are diagrammatic top views of the patterned marks of FIGS. 19A and 19B at an example process stage subsequent to that of FIGS. 19A and 19B.
Figure 20A:
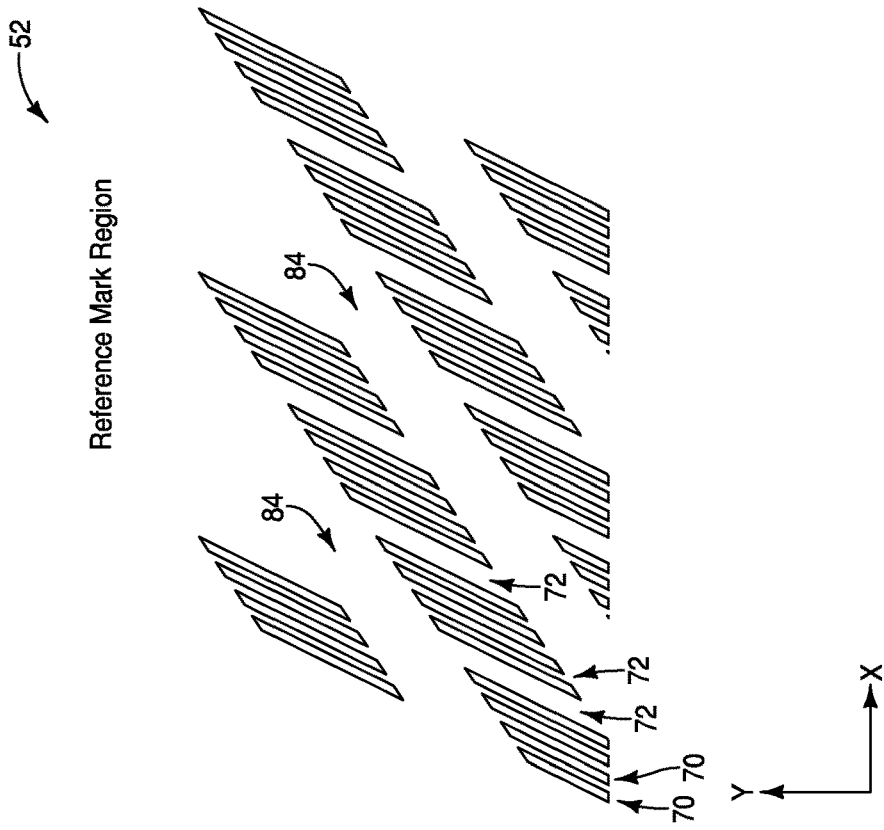

FIGS. 20A and 20B show a processing stage subsequent to that of FIGS. 19A and 19B, and analogous to that of FIGS. 12A and 12B.

Figure 21B:
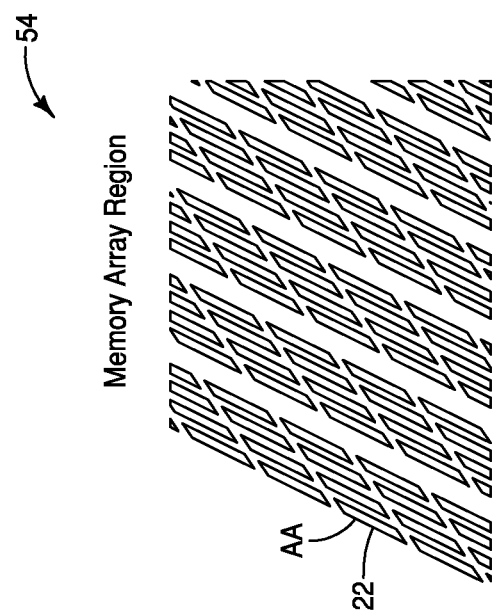
FIGS. 21A and 21B are diagrammatic top views of the patterned marks of FIGS. 19A and 19B at an example process stage subsequent to that of FIGS. 20A and 20B.
Figure 21A:
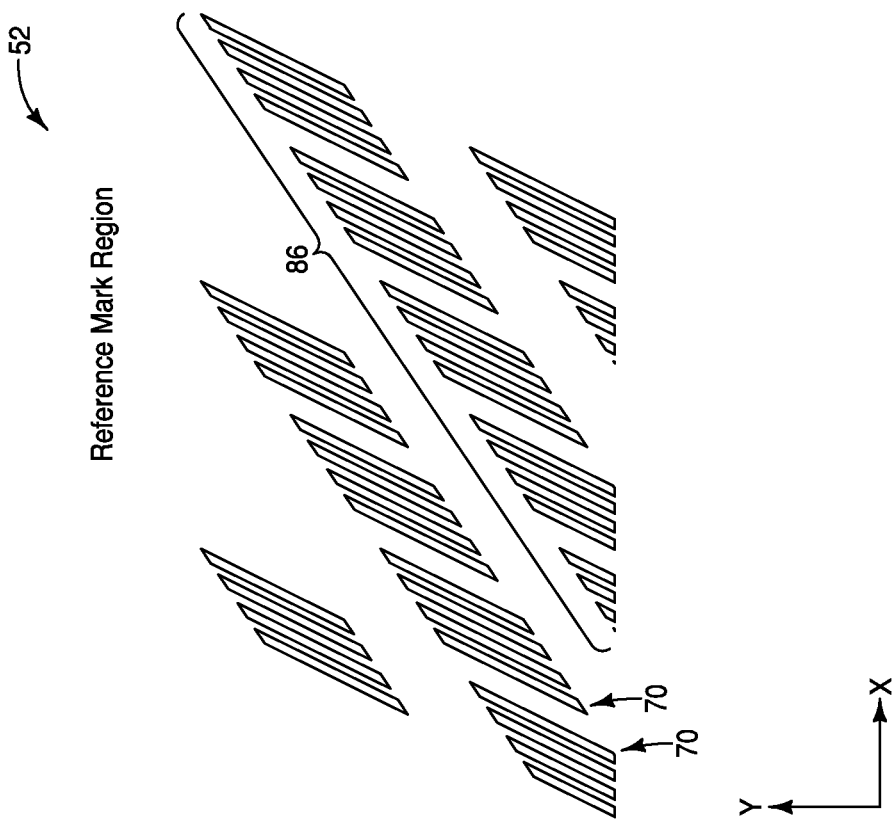

FIGS. 21A and 21B show a processing stage subsequent to that of FIGS. 20A and 20B, and analogous to that of FIGS. 13A and 13B.

FIGS. 22A and 22B show the reference mark region 52 at processing stages analogous to those described above with reference to FIGS. 11A and 12A, respectively. However, the spaces (trenches) 72 at the processing stage of FIG. 22A are not all the same size as one another, and instead include a set of narrow openings 72a and a set of wide openings 72b (with the terms "narrow" and "wide" being utilized relative to one another, and being used to indicate that the trenches 72a are narrower than the trenches 72b). The processing stage of FIG. 22B differs from that of FIG. 12A in that the openings 84 are now circular openings analogous to those described above with reference to FIG. 7B.

The memory array regions 50 corresponding to the reference mark regions 52 of FIGS. 22A and 22B are not shown, but it is to be understood that such memory array regions may be formed with processing analogous to that described above with reference to FIG. 7B. In some embodiments, the holes 46 of FIG. 7B may be considered to correspond to a plurality of first holes of a first hole pattern, and within the second pattern set 74 (analogous to the second pattern set of FIG. 12B); and the holes 84 of FIG. 22B may be considered to correspond to a plurality of second holes within a second hole pattern of the fourth pattern set 76 (analogous to the fourth pattern set of FIG. 12A). Although the illustrated holes 46 and 84 are substantially circular (with the term "substantially circular" meaning circular to within reasonable tolerances of fabrication and measurement), it is to be understood that the holes may comprise other shapes in other embodiments. The illustrated holes 46 and 84 may be considered to be examples of openings which are not linearly extended (in contrast to the trenches described with reference to FIGS. 11 and 12).

The patterned lines 70 of FIG. 22B correspond to an overlay pattern 88, and may be utilized to ascertain alignment of slanted elements (e.g., the elements 22 of FIG. 3 which are slanted relative to the x and y axes of a memory array) with methodology similar to that described above with reference to FIGS. 14 and 15.

Figure 23B:
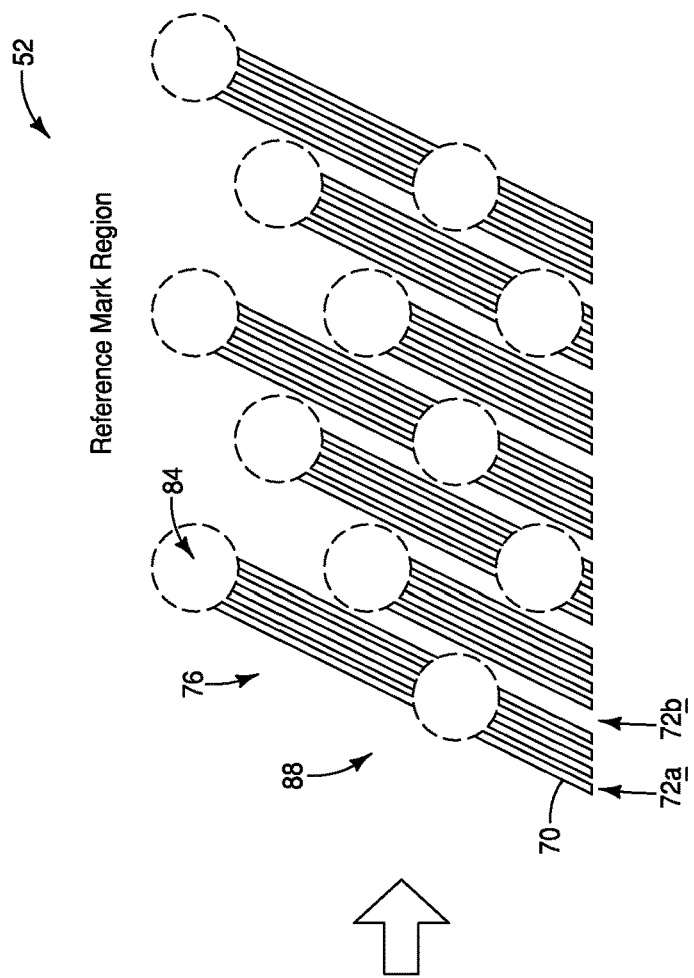
FIGS. 23A and 23B are diagrammatic top views of patterned marks in a reference region at an initial process stage (FIG. 23A) of an example embodiment, and a subsequent process stage (FIG. 23B) of the example embodiment.
Figure 23A:
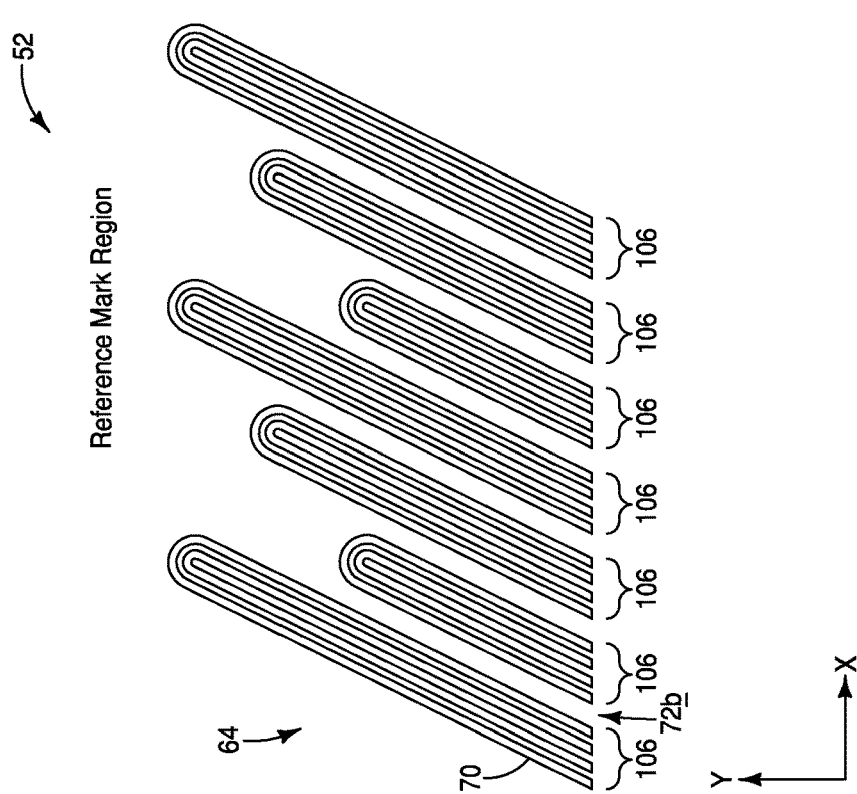

FIGS. 23A and 23B show the reference mark region 52 processed analogously to the processing of FIGS. 22A and 22B, but utilizing thick lines 106 at the stage of FIG. 22A; with such thick lines 106 being consistent with lines formed with pitch-doubling methodology. The pitch-doubling methodology may include any suitable processing, including, for example, one or more processes analogous to those described in U.S. Pat. Nos. 8,389,383 and 8,852,851, and in U.S. patent publication number 2014/0091434. The openings 72 at the process stage of FIG. 23B include two different widths of openings 72a and 72b, with openings 72a being narrower than openings 72b. The memory array regions 50 corresponding to the reference mark regions 52 of FIGS. 23A and 23B are not shown, but it is to be understood that such memory regions may be formed with processing analogous to that described above with reference to FIG. 7B.

Figure 24B:
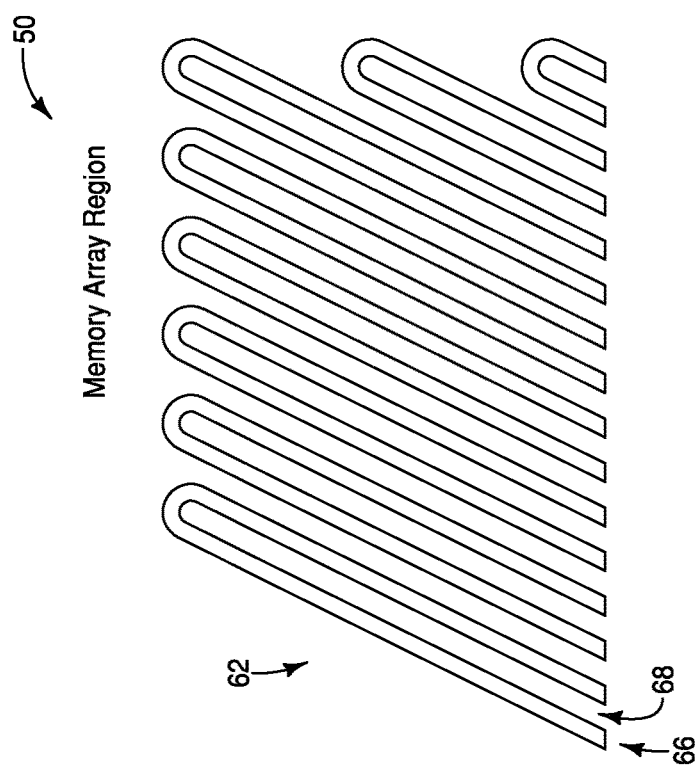
FIGS. 24A and 24B are diagrammatic top views of patterned marks in a reference region (FIG. 24A) and a memory cell region (FIG. 24B) at an example process stage.
Figure 24A:
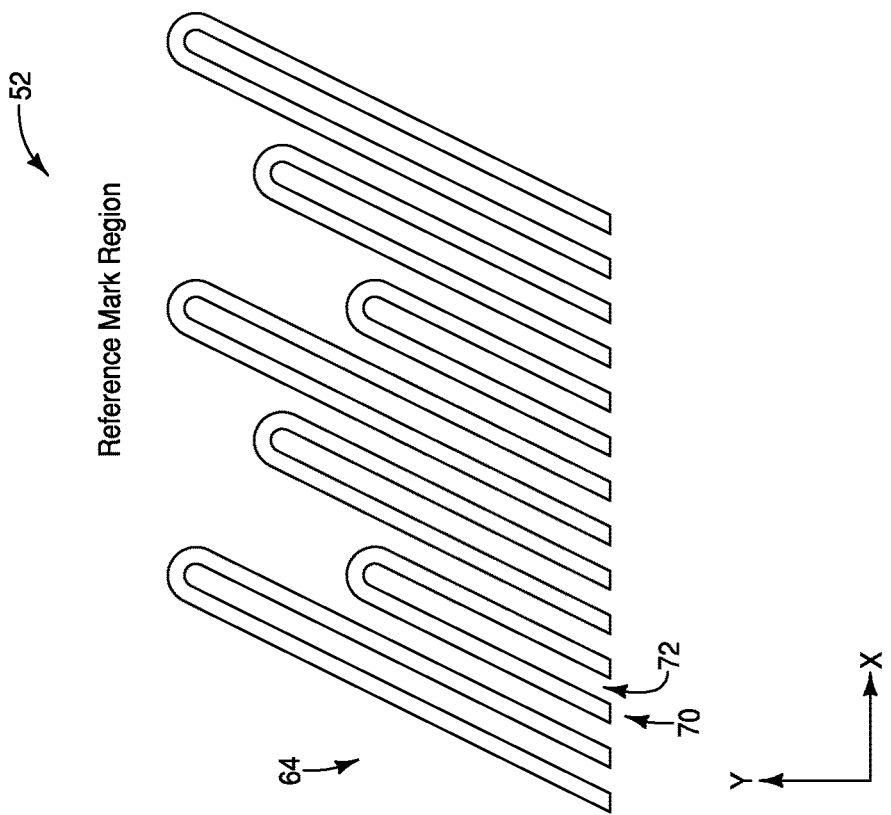

FIGS. 24A and 24B show a processing stage analogous to that described above with reference to FIGS. 11A and 11B.

Figure 25B:
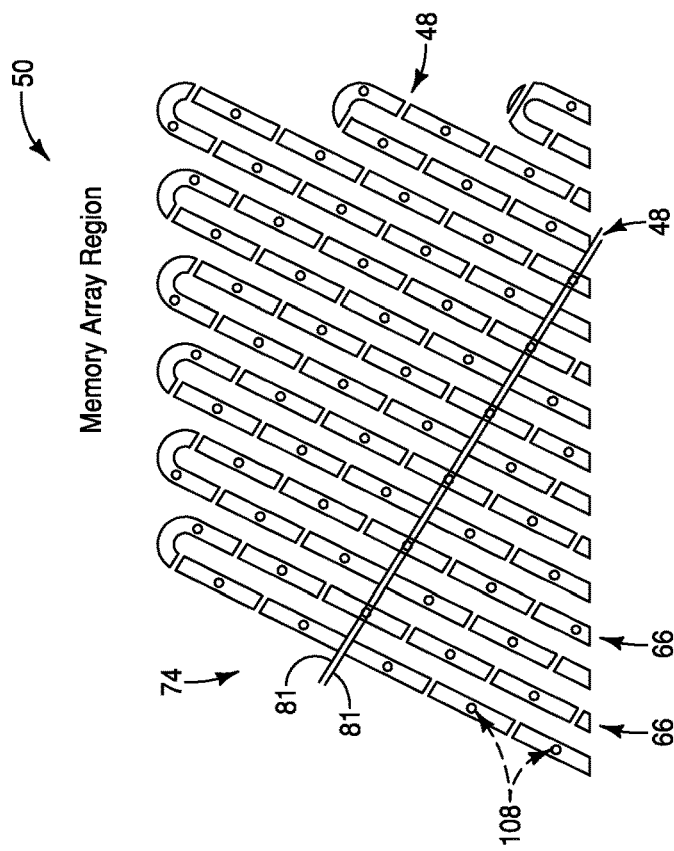
FIGS. 25A and 25B are diagrammatic top views of the patterned marks of FIGS. 24A and 24B at an example process stage subsequent to that of FIGS. 24A and 24B.
Figure 25A:
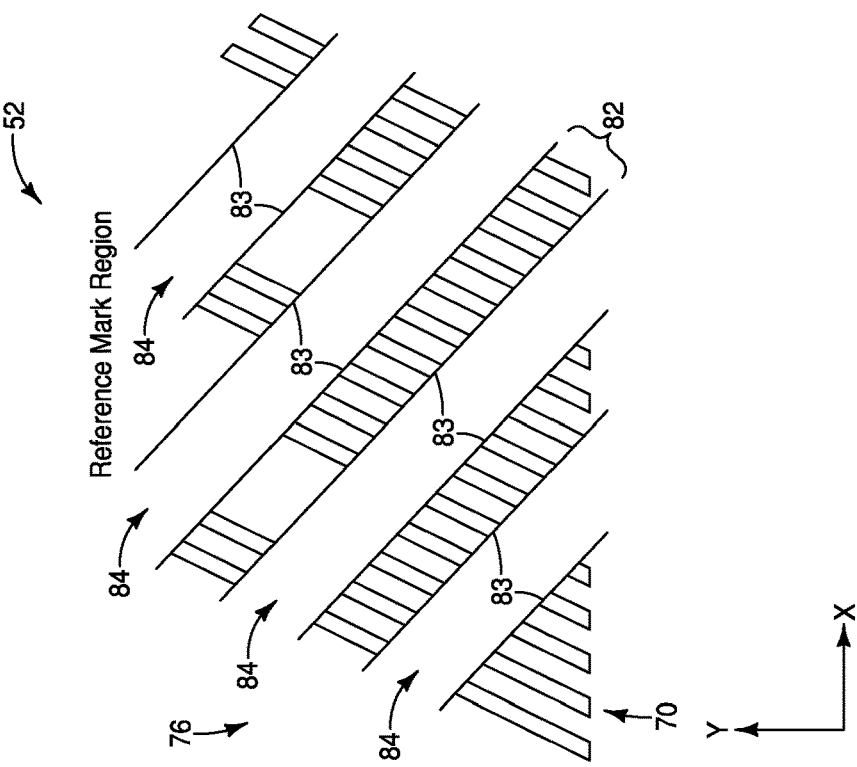

FIGS. 25A and 25B show a processing stage subsequent to that of FIGS. 24A and 24B, and analogous to that of FIGS. 12A and 12B. However, unlike the processing of FIGS. 12A and 12B, the processing of FIGS. 25A and 25B utilizes openings 48 and protective masking structures 108 in a method analogous to that described above with reference to FIG. 7C.

Figure 26B:
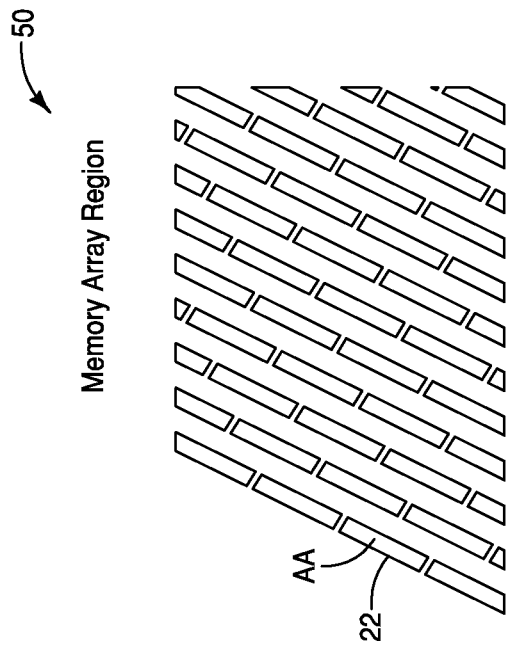
FIGS. 26A and 26B are diagrammatic top views of the patterned marks of FIGS. 24A and 24B at an example process stage subsequent to that of FIGS. 25A and 25B.
Figure 26A:
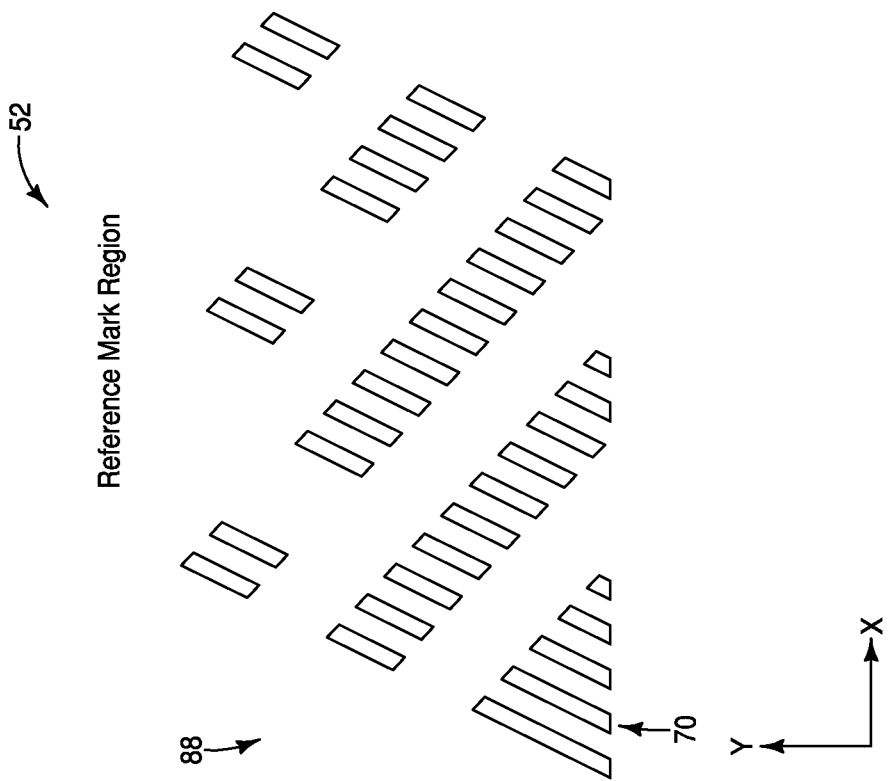

FIGS. 26A and 26B show a processing stage subsequent to that of FIGS. 25A and 25B, and analogous to that of FIGS. 13A and 13B.

Figure 27B:
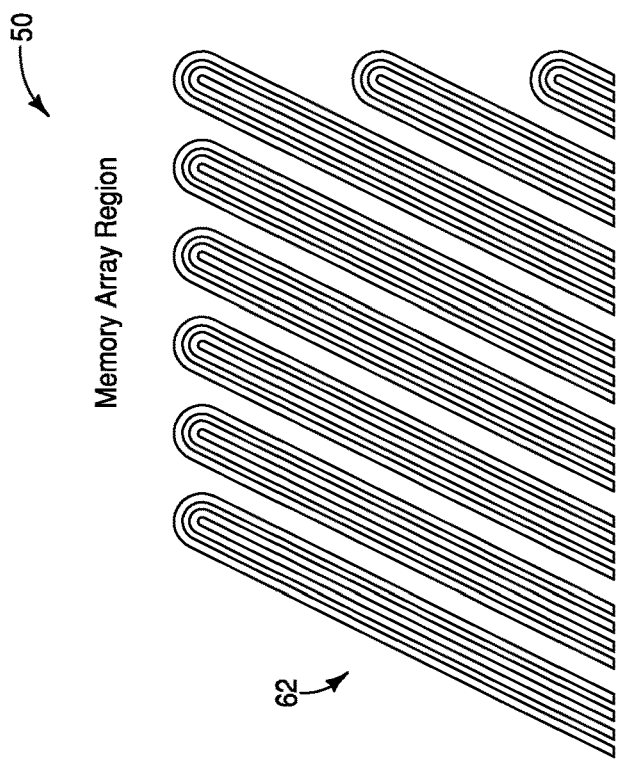
FIGS. 27A and 27B are diagrammatic top views of patterned marks in a reference region (FIG. 27A) and a memory cell region (FIG. 27B) at an example process stage.
Figure 27A:
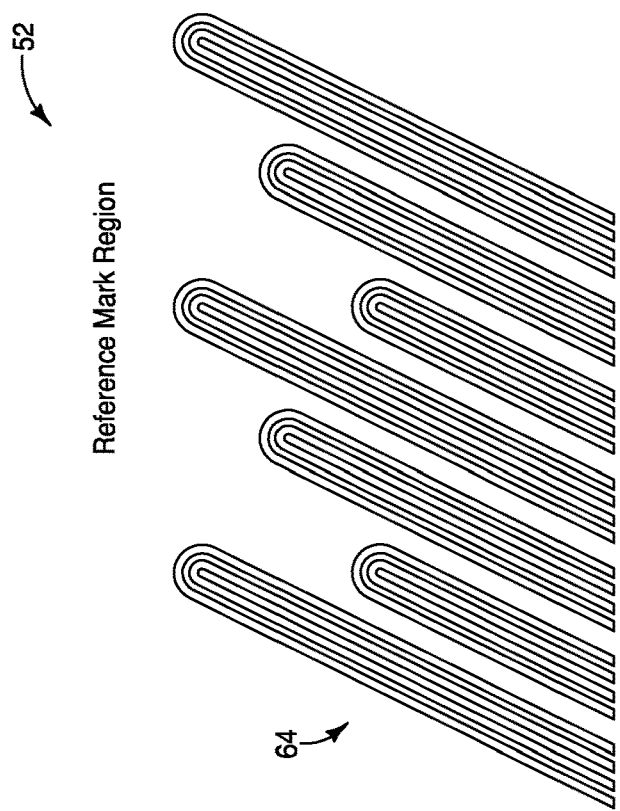
Figure 28B:
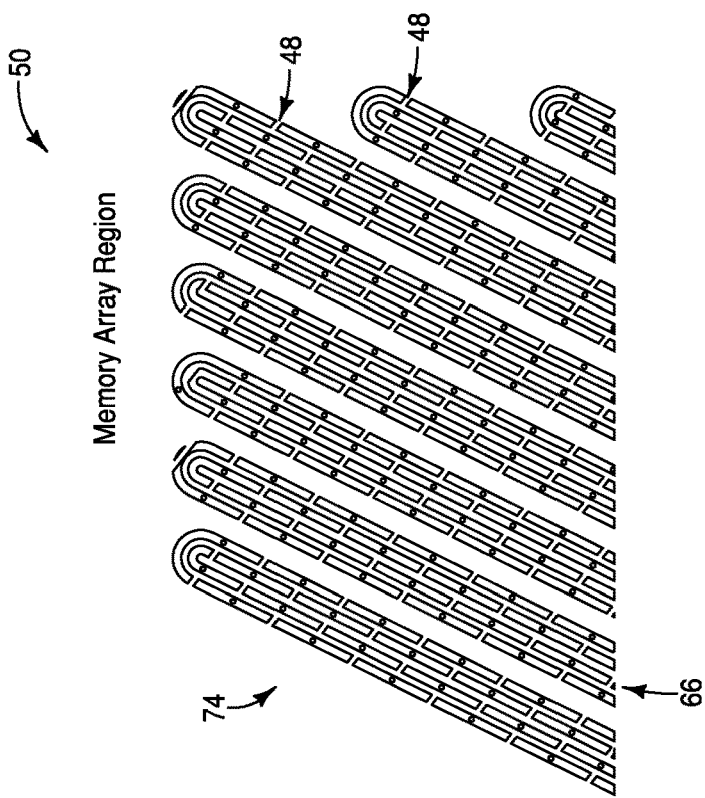
FIGS. 28A and 28B are diagrammatic top views of the patterned marks of FIGS. 27A and 27B at an example process stage subsequent to that of FIGS. 27A and 27B.
Figure 28A:
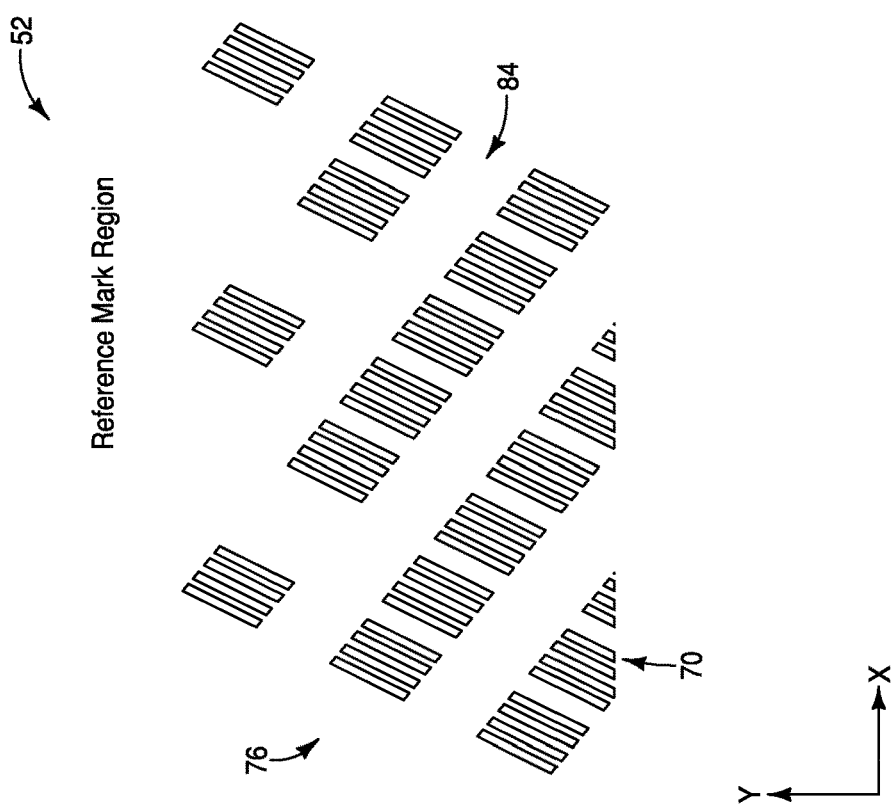
Figure 29B:
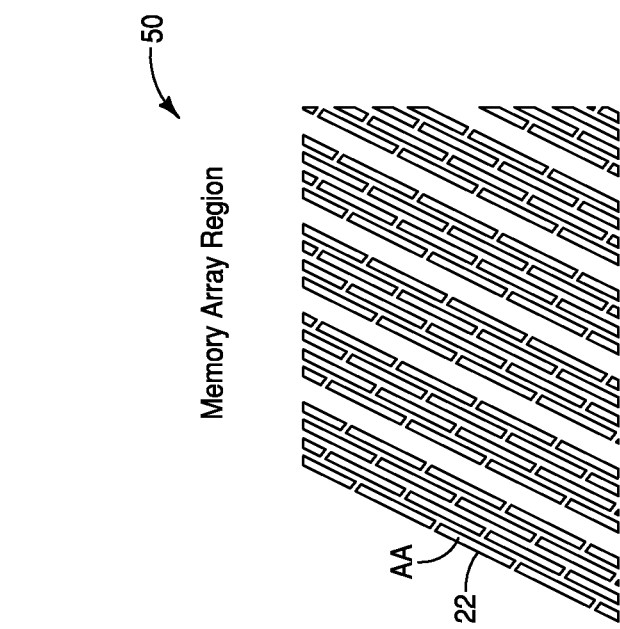
FIGS. 29A and 29B are diagrammatic top views of the patterned marks of FIGS. 27A and 27B at an example process stage subsequent to that of FIGS. 28A and 28B.
Figure 29A:
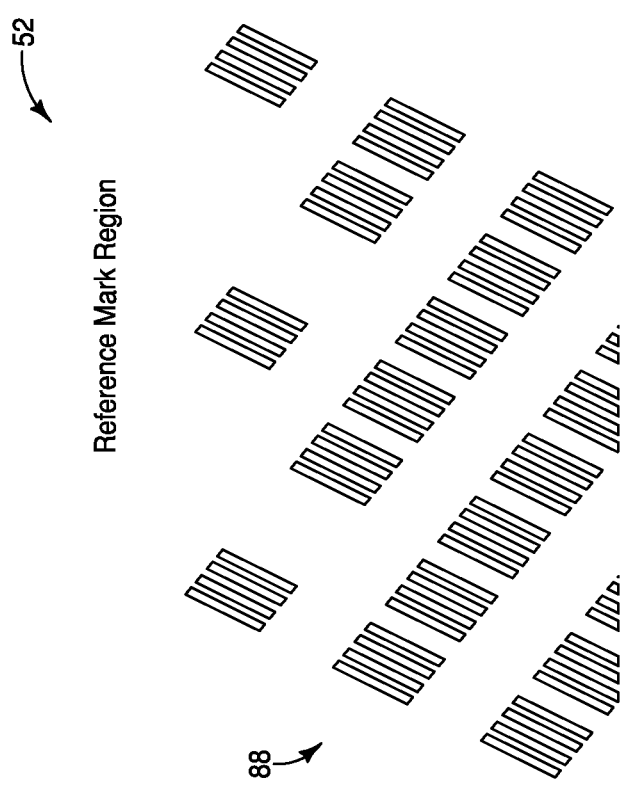

FIGS. 27-29 show processing stages analogous to those of FIGS. 24-26, but in which pitch quadrupling methodologies are also incorporated.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method which includes forming a region for a circuit element, and forming a reference mark for alignment associated with the region. The forming of the region comprises defining a part of the region by use of a first set of patterns, and defining another part of the region by use of a second set of patterns. The second set of patterns intersects the first set of patterns. The forming the reference mark comprises defining a part of the reference mark by use of a third set of patterns that is formed simultaneously with the first set of patterns, and defining another part of the reference mark by use of a fourth set of patterns that is formed simultaneously with the second set of patterns and that intersects the third set of patterns.

Some embodiments include a patterning method which includes provision of a mass of semiconductor material. A memory array region is defined to encompass a first region of the mass, and a reference mark region is defined to encompass a second region of the mass. A first pattern set is formed to extend across the first region, and simultaneously a third pattern set is formed to extend across the second region. The first pattern set includes first lines and first trenches between the first lines. The third pattern set includes alignment marks. The first trenches are extended into the mass to form rails from the semiconductor material of the mass within the first region. The rails are on a first pitch. The alignment marks are parallel to the rails, and are on a third pitch. A second pattern set is formed to extend across the first region, and simultaneously a fourth pattern set is formed to extend across the second region. The second pattern set includes first openings. The first openings are on a second pitch. The fourth pattern set includes second openings which are on a fourth pitch. The first openings are extended into the semiconductor material to subdivide the rails into active-region-pillars. The second openings are extended through the alignment marks to transform the alignment marks into an overlay pattern.

Some embodiments include a patterning method. A mass of semiconductor material is provided. A memory array region is defined to encompass a first region of the mass, and an alignment mark region is defined to encompass a second region of the mass. A first pattern set is formed to extend across the first region. The first pattern set comprises first patterning lines spaced from one another by first trenches. A third pattern set is formed to extend across the second region. The third pattern set comprises first reference lines which are parallel with the first patterning lines. The first trenches are extended into the semiconductor material to form rails extending across the first region. A second pattern set is formed to extend across the first region. The second pattern set comprises second patterning lines spaced from one another by second trenches. The second trenches are extended into the semiconductor material to subdivide the rails into active-region-pillars. A fourth pattern set is formed to extend across the second region. The fourth pattern set comprises second reference lines which are parallel with the second patterning lines. The first patterning lines extend along a first direction, and the second patterning lines extend along a second direction which crosses the first direction. An angle between the first and second directions is less than 90°. The first and second reference lines form an overlay pattern within the second region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method comprising:
    forming a region for a circuit element; and
    forming a reference mark for alignment associated with the region;
    wherein the forming the region comprises:
        defining a part of the region by use of a first set of patterns; and
        defining another part of the region by use of a second set of patterns, the second set of patterns intersecting the first set of patterns; and
    wherein the forming the reference mark comprises:
        defining a part of the reference mark by use of a third set of patterns that is formed simultaneously with the first set of patterns; and
        defining another part of the reference mark by use of a fourth set of patterns that is formed simultaneously with the second set of patterns and that intersects the third set of patterns.

2. The method of claim 1 wherein,
    the first set of patterns is a first line-and-space pattern including a plurality of first lines and a plurality of first spaces;
    the third set of patterns is a second line-and-space pattern including a plurality of second lines and a plurality of second spaces; and
    the plurality of second lines of the second line-and-space pattern includes respective end portions that are disposed so that the respective end portions are removed by the fourth set of patterns.

3. The method of claim 2 wherein,
    the second set of patterns is a third line-and-space pattern including a plurality of third lines and a plurality of third spaces; and
    the fourth set of patterns is a fourth line-and-space pattern including a plurality of fourth lines and a plurality of fourth spaces.

4. The method of claim 2 wherein,
    the second set of patterns is a first hole pattern including a plurality of first holes; and
    the fourth set of patterns is a second hole pattern including a plurality of second holes.

5. The method of claim 1, further comprising forming a comparison mark for alignment after forming the reference mark, wherein the comparison mark is disposed relative to the reference mark.

6. The method of claim 5, further comprising another region for the circuit element, wherein the comparison mark is associated with said other region.

7. A patterning method, comprising:
    providing a mass of semiconductor material; a memory array region being defined to encompass a first region of the mass, and a reference mark region being defined to encompass a second region of the mass;
    forming a first pattern set to extend across the first region, and simultaneously forming a third pattern set to extend across the second region; the first pattern set comprising first lines and first trenches between the first lines; the third pattern set comprising alignment marks;
    extending the first trenches into the mass to form rails from the semiconductor material of the mass within the first region; the rails being on a first pitch; the alignment marks being parallel to the rails, and being on a third pitch;
    forming a second pattern set to extend across the first region, and simultaneously forming a fourth pattern set to extend across the second region; said second pattern set comprising first openings; the first openings being on a second pitch; the fourth pattern set comprising second openings which are on a fourth pitch;
    extending the first openings into the semiconductor material to subdivide the rails into active-region-pillars; and
    extending the second openings through the alignment marks to transform the alignment marks into an overlay pattern.

8. The method of claim 7, wherein the first and third pattern sets are formed before the second and fourth pattern sets.

9. The method of claim 7, wherein the first and third pattern sets are formed after the second and fourth pattern sets.

10. The method of claim 7, wherein the alignment marks are spaced-apart lines.

11. The method of claim 10, wherein the first and third pattern sets are formed utilizing pitch-multiplication methodology.

12. The method of claim 11, wherein the first and third pattern sets are formed utilizing pitch-doubling methodology.

13. The method of claim 11, wherein the first and third pattern sets are formed utilizing pitch-quadrupling methodology.

14. The method of claim 7, wherein the first and second openings are linear trenches.

15. The method of claim 7, wherein the first and second openings have non-linear shapes.

16. The method of claim 15, wherein the first and second openings are substantially circular.

17. The method of claim 7, wherein the first and third pitches are approximately the same as one another.

18. The method of claim 17, wherein the second and fourth pitches are approximately the same as one another.

19. The method of claim 17, wherein the second and fourth pitches are different from one another.

20. The method of claim 7, further comprising forming features within the first region, and simultaneously forming component marks within the second region and aligned with the features; the component marks within the second region being juxtaposed with the overlay pattern to indicate alignment between the features and the active-region-pillars.

21. The method of claim 20, wherein the features are wordlines.

22. The method of claim 20, wherein the features are bitlines.

23. The method of claim 20, wherein the features are bitline openings.

24. A patterning method, comprising:
providing a mass of semiconductor material; a memory array region being defined to encompass a first region of the mass, and an alignment mark region being defined to encompass a second region of the mass;
forming a first pattern set to extend across the first region, the first pattern set comprises first patterning lines spaced from one another by first trenches;
forming a third pattern set to extend across the second region; the third pattern set comprising first reference lines which are parallel with the first patterning lines;
extending the first trenches into the semiconductor material to form rails extending across the first region;
forming a second pattern set to extend across the first region; the second pattern set comprising second patterning lines spaced from one another by second trenches;
extending the second trenches into the semiconductor material to subdivide the rails into active-region-pillars;
forming a fourth pattern set to extend across the second region; the fourth pattern set comprising second reference lines which are parallel with the second patterning lines; and
wherein:
the first patterning lines extend along a first direction, and the second patterning lines extend along a second direction which crosses the first direction;
an angle between the first and second directions is less than 90°; and
the first and second reference lines form an overlay pattern within the second region.

25. The method of claim 24, wherein the first patterning lines and the first trenches of the first pattern set are formed utilizing pitch-multiplication methodology.

26. The method of claim 24, wherein the first patterning lines and the first trenches of the first pattern set are formed utilizing pitch-doubling methodology.

27. The method of claim 24, wherein the first patterning lines and the first trenches of the first pattern set are formed utilizing pitch-quadrupling methodology.

28. The method of claim 24, further comprising forming features within the memory array region, and simultaneously forming component marks within the alignment mark region and aligned with the features; the component marks within the alignment mark region being juxtaposed with the overlay pattern to indicate alignment between the features and the active-region-pillars.

29. The method of claim 28 wherein the features are wordlines.

30. The method of claim 28, wherein the features are bitlines.

31. The method of claim 28, wherein the features are bitline openings.

* * * * *